US008576624B2

(12) United States Patent
Dutta et al.

(10) Patent No.: US 8,576,624 B2
(45) Date of Patent: Nov. 5, 2013

(54) ON CHIP DYNAMIC READ FOR NON-VOLATILE STORAGE

(71) Applicant: SanDisk Technologies Inc., Plano, TX (US)

(72) Inventors: Deepanshu Dutta, San Jose, CA (US); Dana Lee, Saratoga, CA (US); Jeffrey Lutze, San Jose, CA (US)

(73) Assignee: SanDisk Technologies, Inc., Plano, TX (US)

( * ) Notice: Subject to any disclaimer, the term of this patent is extended or adjusted under 35 U.S.C. 154(b) by 0 days.

(21) Appl. No.: 13/759,700

(22) Filed: Feb. 5, 2013

(65) Prior Publication Data

US 2013/0148425 A1    Jun. 13, 2013

Related U.S. Application Data

(62) Division of application No. 13/239,194, filed on Sep. 21, 2011, now Pat. No. 8,406,053.

(51) Int. Cl.
*G11C 11/34* (2006.01)
*G11C 16/04* (2006.01)
*G11C 16/06* (2006.01)

(52) U.S. Cl.
USPC ............ 365/185.03; 365/185.17; 365/185.18; 365/185.21

(58) Field of Classification Search
USPC .......................... 365/185.03, 185.18, 185, 21
See application file for complete search history.

(56) References Cited

U.S. PATENT DOCUMENTS

| 7,177,197 | B2 | 2/2007 | Cernea |
| 7,471,562 | B2 | 12/2008 | Hung et al. |
| 7,844,878 | B2 | 11/2010 | Aasheim et al. |
| 7,859,932 | B2 | 12/2010 | Mokhlesi |
| 7,876,621 | B2 | 1/2011 | Sharon et al. |
| 7,903,468 | B2 | 3/2011 | Litsyn et al. |
| 7,957,187 | B2 | 6/2011 | Mokhlesi et al. |
| 8,201,053 | B2 | 6/2012 | Aasheim et al. |
| 2004/0153902 | A1 | 8/2004 | Machado et al. |
| 2008/0263266 | A1 | 10/2008 | Sharon et al. |
| 2008/0285351 | A1 | 11/2008 | Shlick et al. |
| 2009/0135646 | A1 | 5/2009 | Murin et al. |

(Continued)

FOREIGN PATENT DOCUMENTS

WO    2012/097136 A2    7/2012

OTHER PUBLICATIONS

U.S. Appl. No. 13/761,956, filed Feb. 7, 2013.
Notice of Allowance and Fee(s) Due dated Nov. 28, 2012, U.S. Appl. No. 13,239,194, 17 pages.

(Continued)

*Primary Examiner* — Ly D Pham
(74) *Attorney, Agent, or Firm* — Vierra Magen Marcus LLP

(57) ABSTRACT

Dynamically determining read levels on chip (e.g., memory die) is disclosed herein. One method comprises reading a group of non-volatile storage elements on a memory die at a first set of read levels. Results of the two most recent of the read levels are stored on the memory die. A count of how many of the non-volatile storage elements in the group showed a different result between the reads for the two most recent read levels is determined. The determining is performed on the memory die using the results stored on the memory die. A dynamic read level is determined for distinguishing between a first pair of adjacent data states of the plurality of data states based on the read level when the count reaches a pre-determined criterion. Note that the read level may be dynamically determined on the memory die.

21 Claims, 18 Drawing Sheets

(56) References Cited

U.S. PATENT DOCUMENTS

| | | |
|---|---|---|
| 2009/0323412 A1 | 12/2009 | Mokhlesi et al. |
| 2010/0017684 A1 | 1/2010 | Yang |
| 2010/0020611 A1 | 1/2010 | Park |
| 2010/0309719 A1 | 12/2010 | Li et al. |

OTHER PUBLICATIONS

Amendment Under 37 C.F.R. § 1.312 dated Dec. 14, 2012, U.S. Appl. No. 13/239,194, 8 pages.

International Search Report and Written Opinion of the International Searching Authority dated Feb. 8, 2013, PCT Application No. PCT/US2012/055046 filed Sep. 13, 2012, 14 pages.

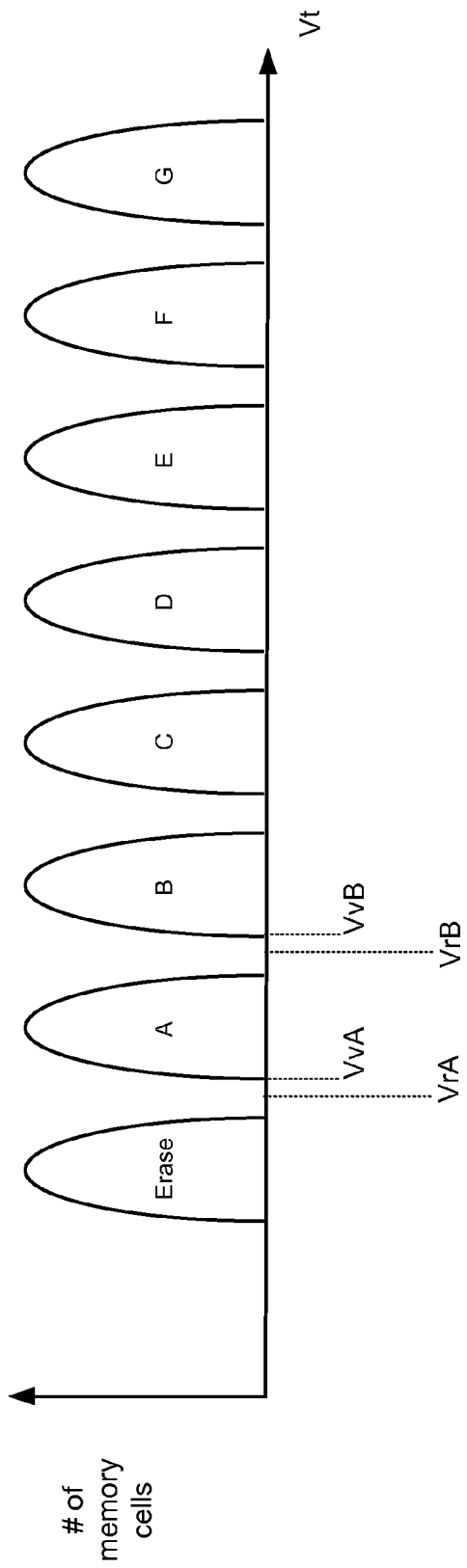
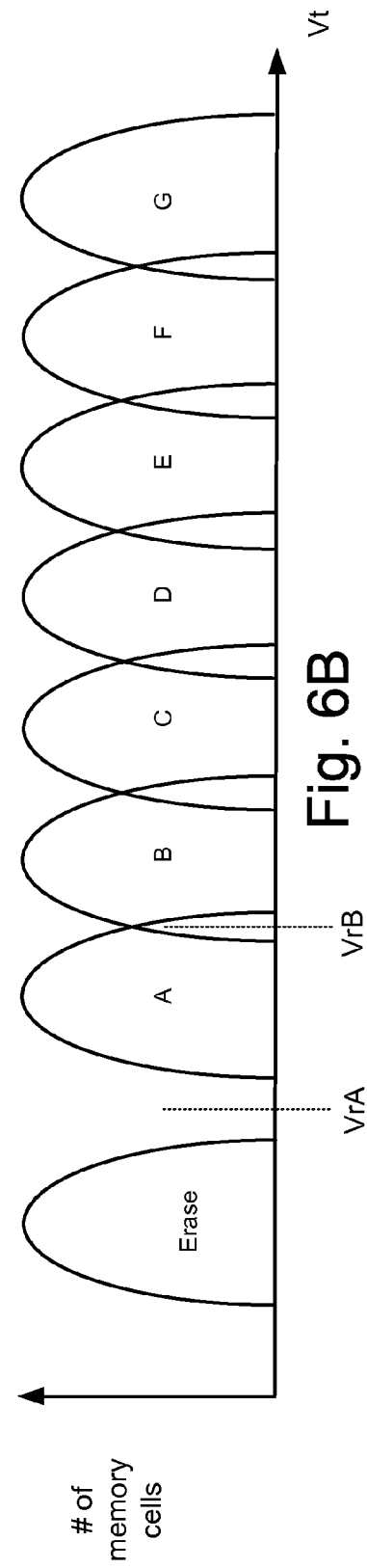

ON CHIP DYNAMIC READ FOR NON-VOLATILE STORAGE

CLAIM OF PRIORITY

This application is a divisional application of co-pending U.S. patent application Ser. No. 13/239,194, entitled "ON CHIP DYNAMIC READ FOR NON-VOLATILE STORAGE," by Dutta et al., filed Sep. 21, 2011, and incorporated herein by reference in its entirety.

BACKGROUND

The present disclosure relates to technology for non-volatile memory.

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate and channel regions are positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage VPGM applied to the control gate during a program operation is applied as a series of pulses that increase in magnitude over time. In one possible approach, the magnitude of the pulses is increased with each successive pulse by a predetermined step size, e.g., 0.2-0.4 V. VPGM can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically VPGM is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

Further, during a read operation, read reference voltages are applied to a set of storage elements to be read, and a determination is made as to which read reference voltage causes a storage element to become conductive. The read reference voltages are set to allow data states of the storage elements to be distinguished. However, the read reference voltages are typically fixed and do not account for the fact that the threshold voltage distribution of a set of storage elements can change, e.g., due to factors such as charge leakage, temperature changes, number of programming cycles and the like. As a result, read errors can occur.

To address the shift in threshold voltage distributions, new read reference voltages can be determined "dynamically". However, some conventional approaches for dynamically determining new read levels need to construct the threshold voltage distribution for each state. However, this requires substantial computations, which may be time consuming. Also, these computations may need to be performed in a memory controller.

One conventional method for dynamically determining read levels is to read the data and then determine whether errors can be corrected using error correction codes (ECC). If ECC cannot correct the errors, then read levels may be shifted and the data read again. If ECC still cannot correct errors, then process is repeated until the data is successfully read. This process typically involves transferring the data out of the memory array in order to attempt to correct using ECC. Both transferring the data out of the memory array and performing the ECC may take up considerable time.

Moreover, as memory arrays scale down, many parasitic effects such as cell to cell interferences, and non-ideal effects such as program noise increase which lead to wider threshold voltage distributions for each programmed state. Thus, the room available between each programmed state is getting smaller and smaller with each generation, which means the error fail bit count is increasing. This makes it even more important to choose read levels for each state such that the error fail bit count is minimized.

BRIEF DESCRIPTION OF THE DRAWINGS

FIG. 6A depicts an example set of Vt distributions.
FIG. 6B depicts an example set of Vt distributions.

DETAILED DESCRIPTION

Dynamically determining read levels on chip (e.g., memory die) is disclosed herein. In one embodiment, an initial read of non-volatile storage elements (e.g., memory cells) is performed at a default read level. Note that this read may determine whether each memory cell has a threshold voltage above or below the read level. Results of the read may be stored in a first set of data latches on the memory die. Then, the read level may be adjusted slightly prior to reading again. Results of the second read may be stored in a second set of data latches. Then, the results in the two sets of data latches may be compared, on a memory cell by memory cell basis. In effect, the comparison may determine which memory cells showed a different result for the two reads (e.g., "mis-compares"). If the number of mis-compares is not less than a pre-determined threshold, then another read may be performed at another read level. When the number of mis-compares is less than the pre-determined threshold, the results of the last read may be used as final read results. Moreover, the last read level that was used may be used as a read level for further read operations. Thus, the read level may be dynamically determined. Note that the read level may be dynamically determined on the memory die.

Note that one embodiment does not transfer data off the memory die to an external controller in order to dynamically establish the read levels. Moreover, one embodiment does not perform an ECC algorithm to dynamically establish the read levels. Therefore, time is saved by not having to transfer data off from the memory die in order to find suitable read levels. Moreover, time is saved by not having to perform an ECC algorithm in order to find suitable read levels.

Also note that in some cases it may be desirable to sell a memory device without an external controller. For example, some customers may want to provide their own memory controller. Therefore, embodiments that dynamically determine read levels on chip have the advantage of providing a memory device without any special requirements that the controller determine suitable read levels.

Figure 1:
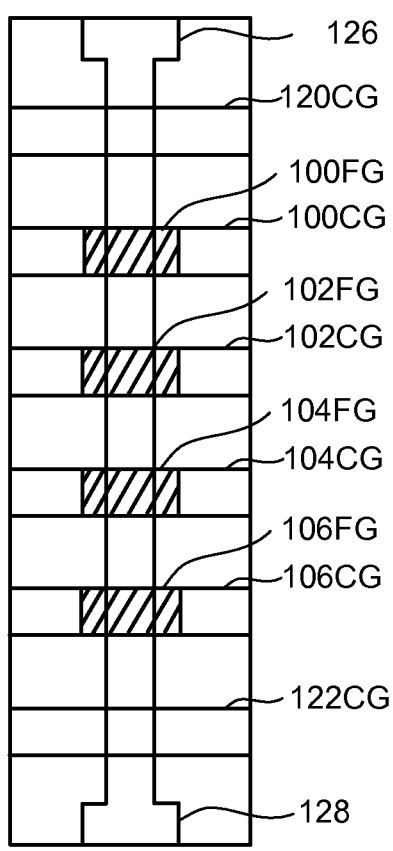
FIG. 1 is a top view of a NAND string.
Figure 2:
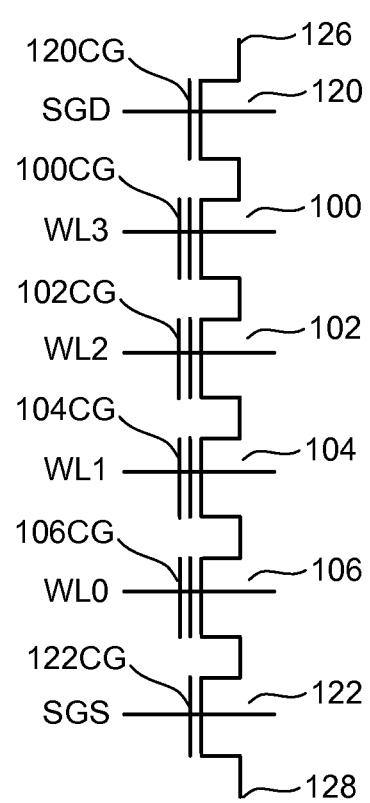
FIG. 2 is an equivalent circuit diagram of the NAND string.

In some embodiments, dynamically determining read levels on chip is performed using a NAND memory array. However, note that dynamically determining read levels may be performed on other types of non-volatile storage. NAND is an example of a flash memory system which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have fewer than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Each memory cell can store data (analog or digital). When storing one bit of digital data, the range of possible threshold voltages of the memory cell is divided into two ranges which are assigned logical data "1" and "0." In one example of a NAND type flash memory, the threshold voltage is negative after the memory cell is erased, and defined as logic "1." The threshold voltage after programming is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

In the case of storing multiple levels of data, the range of possible threshold voltages is divided into the number of levels of data. For example, if four levels of information is stored (two bits of data), there will be four threshold voltage ranges assigned to the data values "11", "10", "01", and "00."
In one example of a NAND type memory, the threshold voltage after an erase operation is negative and defined as "11". Positive threshold voltages are used for the data states of "10", "01", and "00." If eight levels of information (or states) are stored (e.g. for three bits of data), there will be eight threshold voltage ranges assigned to the data values "000", "001", "010", "011" "100", "101", "110" and "111."

The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted or otherwise randomized to reduce data pattern sensitivity and even wear on the memory cells.

Relevant examples of NAND type flash memories and their operation are provided in the following U.S. patents/patent applications, all of which are incorporated herein by reference: U.S. Pat. Nos. 5,570,315; 5,774,397; 6,046,935; 6,456,528; and U.S. Pat. Publication No. US2003/0002348. The discussion herein can also apply to other types of flash memory in addition to NAND as well as other types of non-volatile memory.

Other types of non-volatile storage devices, in addition to NAND flash memory, can also be used. For example, a so called TANOS structure (consisting of a stacked layer of TaN—Al2O3—SiN—SiO2 on a silicon substrate), which is basically a memory cell using trapping of charge in a nitride layer (instead of a floating gate), can also be used. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The memory cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar memory cell in a split-gate configuration where a doped polysilicon gate extends over a portion of the memory cell channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. Other types of memory devices can also be used.

Figure 3:
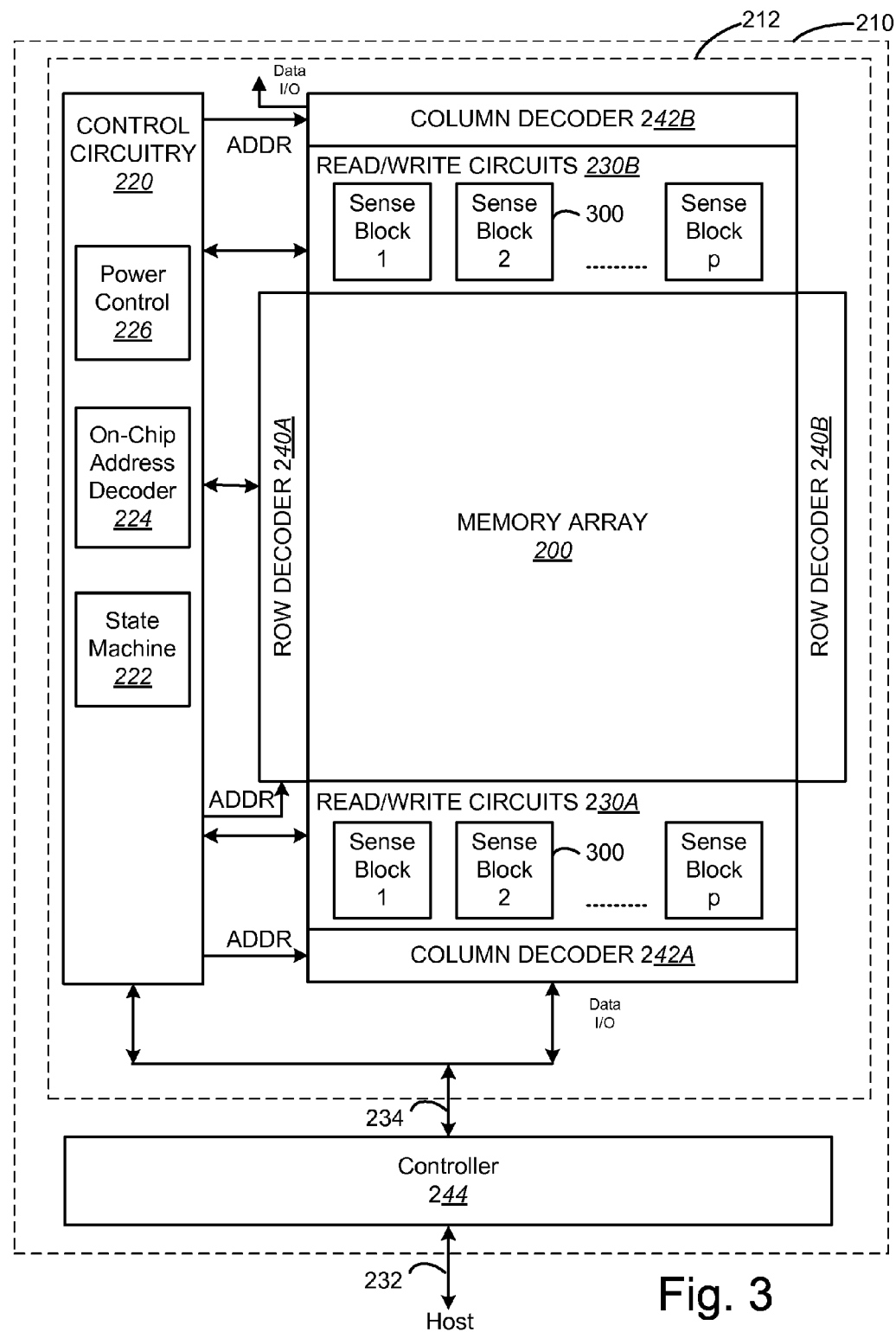
FIG. 3 is a block diagram of a non-volatile memory system.

FIG. 3 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 4:
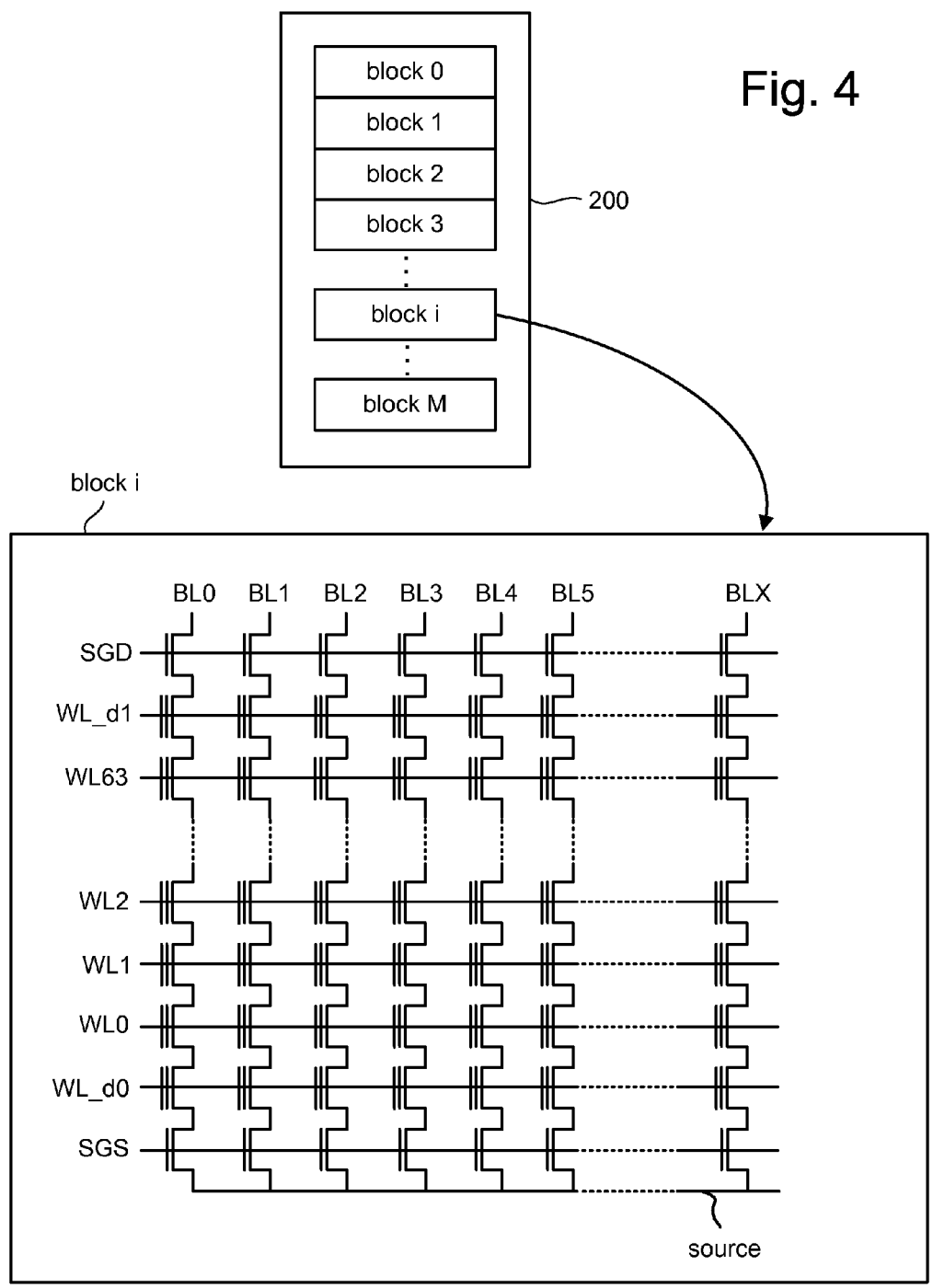
FIG. 4 is a block diagram depicting one embodiment of a memory array.

FIG. 4 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. A portion of the controller (described below) calculates the ECC when data is being programmed into the array, and also checks it when data is being read from the array. In one embodiment, the controller 244 is able to correct a certain number of misreads, based on the ECC.

Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 4 shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and two dummy memory cells. Data memory cells can store user or system data. Dummy memory cells are typically not used to store user or system data. Some embodiments do not include dummy memory cells.

Figure 5:
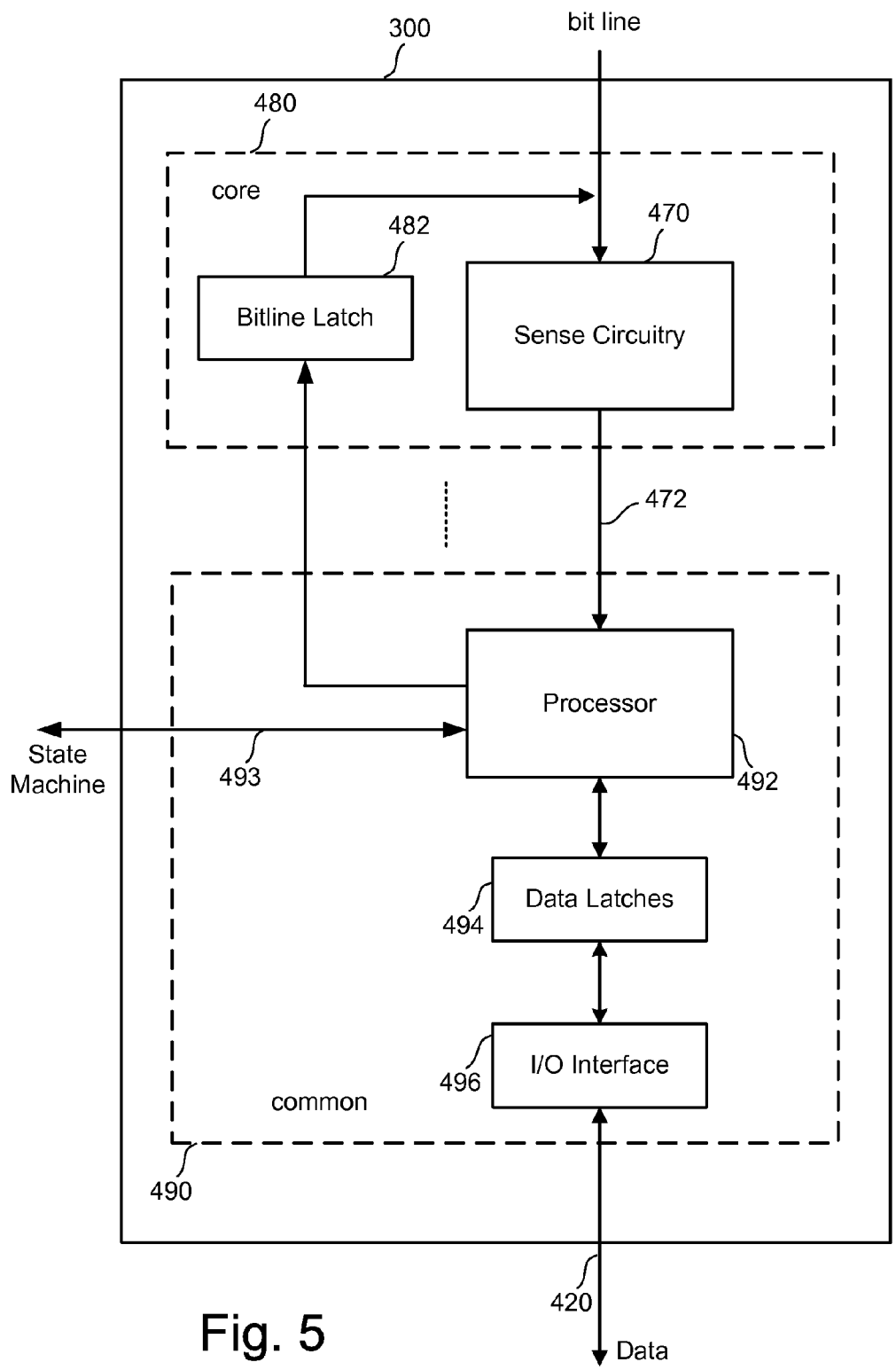
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, which is incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. In some embodiments, the data latches 494 are used to store first and second read results, as a part of a process that dynamically determines read levels. Data latches 494 may also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 420. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 492 monitors the verified memory state relative to the desired memory state. When the two are in agreement, processor 492 sets the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 420, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. patent application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example Vt distributions corresponding to data states for the memory cell array when each memory cell stores three bits of data. Other embodiment, however, may use more or fewer than three bits of data per memory cell. FIG. 6A shows eight Vt distributions corresponding to an Erase state and programmed states A-G. In one embodiment, the threshold voltages in the Erase state are negative and the threshold voltages in the programmed states A-G are positive. However, the threshold voltages in one or more of programmed states A-G may be negative. Some or all of the threshold voltages in the Erase state could be positive.

Between each of the data states Erase-G are read reference voltages used for reading data from memory cells. For example, FIG. 6A shows read reference voltage VrA between the erase state and the A-state, and VrB between the A-state and B-state. By testing whether the threshold voltage of a given memory cell is above or below the respective read reference voltages, the system can determine what state the memory cell is in.

At or near the lower edge of each programmed state are verify reference voltages. For example, FIG. 6A shows VvA for the A-state and VvB for the B-state. When programming memory cells to a given state, the system will test whether those memory cells have a threshold voltage greater than or equal to the verify reference voltage.

FIG. 6B illustrates that Vt distributions can partially overlap since the error correction algorithm can handle a certain percentage of cells that are in error. Note that in some embodiments, at one point in time the threshold voltage distribution may resemble FIG. 6A and at another time the threshold voltage distributions may overlap, as in FIG. 6B. For example, just after programming, the threshold voltage distribution may resemble FIG. 6A. However, over time, the threshold voltages of memory cells may shift, such that there may be overlap.

Also note that contrary to the equal spacing/width of the depicted threshold voltage distributions, various distributions may have different widths/spacings in order to accommodate varying amounts of susceptibility to data retention loss.

Figure 7:
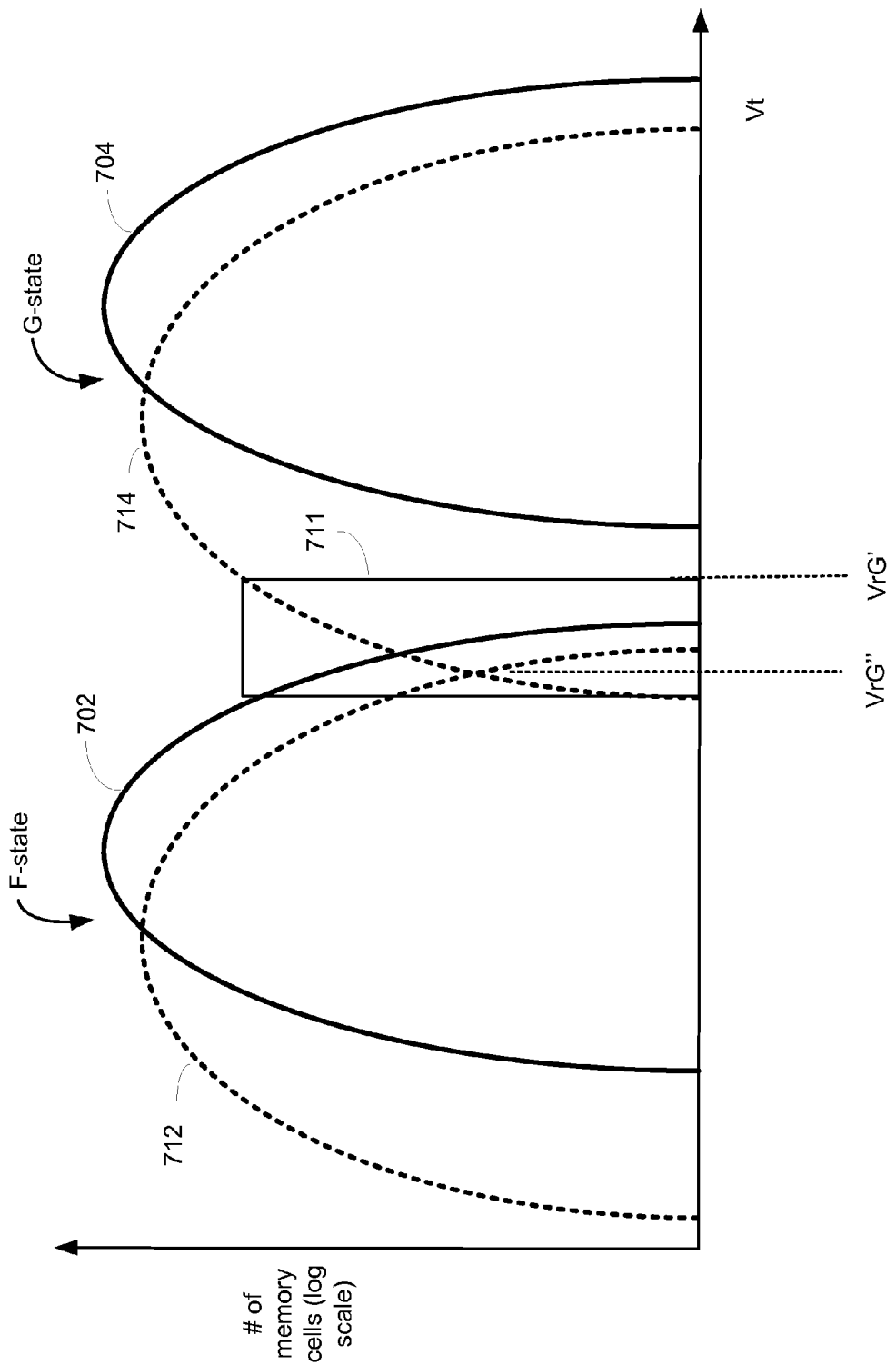
FIG. 7 shows threshold voltage distributions for two data states.

FIG. 7 shows threshold voltage distributions for two of the data states (F-state and G-state), each for two points in time. Curves 702 and 704 show Vt distributions corresponding to just after the memory cells were programmed. Curves 712 and 714 show Vt distributions corresponding to some time after the memory cells were programmed. Just after programming, there is a significant gap between the F-state and G-state. However, after some time, the threshold voltages may shift for a number of reasons. One possible reason is that the memory device may have rested without use for a period of time, resulting in charge loss from the memory cells, referred to as data retention loss. If the memory device was in a hot environment, such as an automobile, data retention may be a greater problem.

Curve 714 shows a possible shift for the threshold distribution of the G-state. In this example, the threshold voltages have in general shifted downward, due to charge loss from the memory cell. Also, there has been some spreading of the range of the threshold voltages, due to cell-to-cell variation in the amount of threshold shift down. Curve 712 shows a possible shift for the threshold distribution of the F-state. Similar to the G-state, the threshold voltages for the F-state have in general shifted downward. Also, there has been some spreading of the range of the threshold voltages. Note that other shifts in the threshold voltages are possible.

Voltage level VrG' represents a read level that is suitable for use just after programming. Voltage level VrG" represents a read level that is suitable for use after the threshold voltage distributions have shifted to curves 712 and 714. In this example, read point VrG" corresponds to the valley of curves 712 and 714 (where the curves first intersect), although a different read level might be used.

Note that if read level VrG' were to be used after the threshold voltage distributions have shifted to curves 712 and 714, then memory cells on curve 714 with threshold voltages below VrG' would be misread. In general, box 711 represents memory cells with threshold voltages on curve 714 that would be misread if read level VrG' were to be used. Using VrG' would not result in misreads of memory cells with threshold voltages on curve 712. However, as can be seen there are a substantial number of memory cells on curve 714. Note that the y-axis may be on a log scale.

Error correction algorithms are able to handle some misreads. However, if the number of misreads is too high then the data cannot be successfully read. For example, if the number of misreads is greater than the error correction ability of one embodiment of controller 244, then the data cannot be accurately read.

However, by dynamically adjusting the read level to, for example, VrG", the data can be successfully read. Note that there still may be a small number of misreads; however, error correction should be able to correct these misreads. In this example, a misread occurs for memory cells on curve 714 with a threshold voltage lower than VrG". A misread occurs for memory cells on curve 712 with a threshold voltage higher than VrG". Note that due to the log scale, there may be relatively few memory cells at the intersection of curves 712 and 714.

In one embodiment, the read level is dynamically adjusted to minimize the misreads. However, it is not required that the misreads be minimized. In one embodiment, the read level is dynamically adjusted such that the misreads are sufficiently low such that they may be corrected using ECC. In some cases, a relatively strong ECC may be available, in which case a higher number of misreads may be tolerable.

Note that there may be variations from one memory die to the next, which may lead to differences in threshold voltage distributions. Also, within a memory die there may be variations. For example, there could be differences from one block to the next. Also, there may be word line to word line variations within a block. One possible reason for these differences is that various interference effects may be different depending on the die, block, word line, etc. This may lead to differences in threshold distribution widths. Also, there may be differences in history of the data written to different blocks. For example, two blocks programmed at two different times, which have been resting for different periods of time, will show different amount of threshold shift. Therefore, in general, the optimum read levels may differ based on die, block, word line, etc.

Read levels may be dynamically determined for any unit (die, block, word line, etc.). Note that even for memory arrays that are freshly programmed, there may be differences between dies, blocks, word lines, etc., which may lead to differences between the threshold distributions. In other words, it may not be that case that one set of read levels are suitable for all dies, blocks, word lines, etc. Therefore, dynamically determining read levels may be used for freshly programmed memory. This may allow for optimizing read levels for dies, blocks, word lines, etc.

Figure 8:
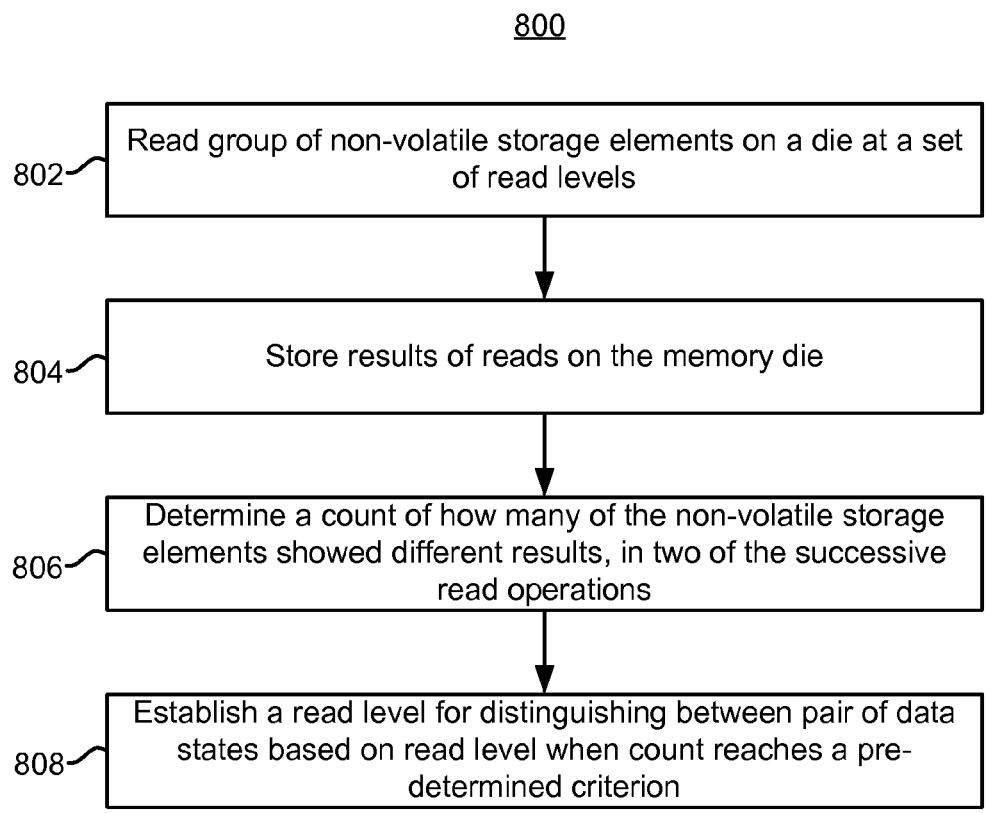
FIG. 8 is a flowchart of one embodiment of a process of dynamically determining a read level on-chip.

FIG. 8 is a flowchart of one embodiment of a process 800 of dynamically determining a read level on-chip. Note that process 800 describes a general flow and that the steps may be performed in a different order. Also, note that a step may comprise sub-steps. In some cases, after performing one or more sub-steps of one step, a different step or steps (or portions thereof) may be performed. Then, or more sub-steps of the first step may be performed.

Figure 9:
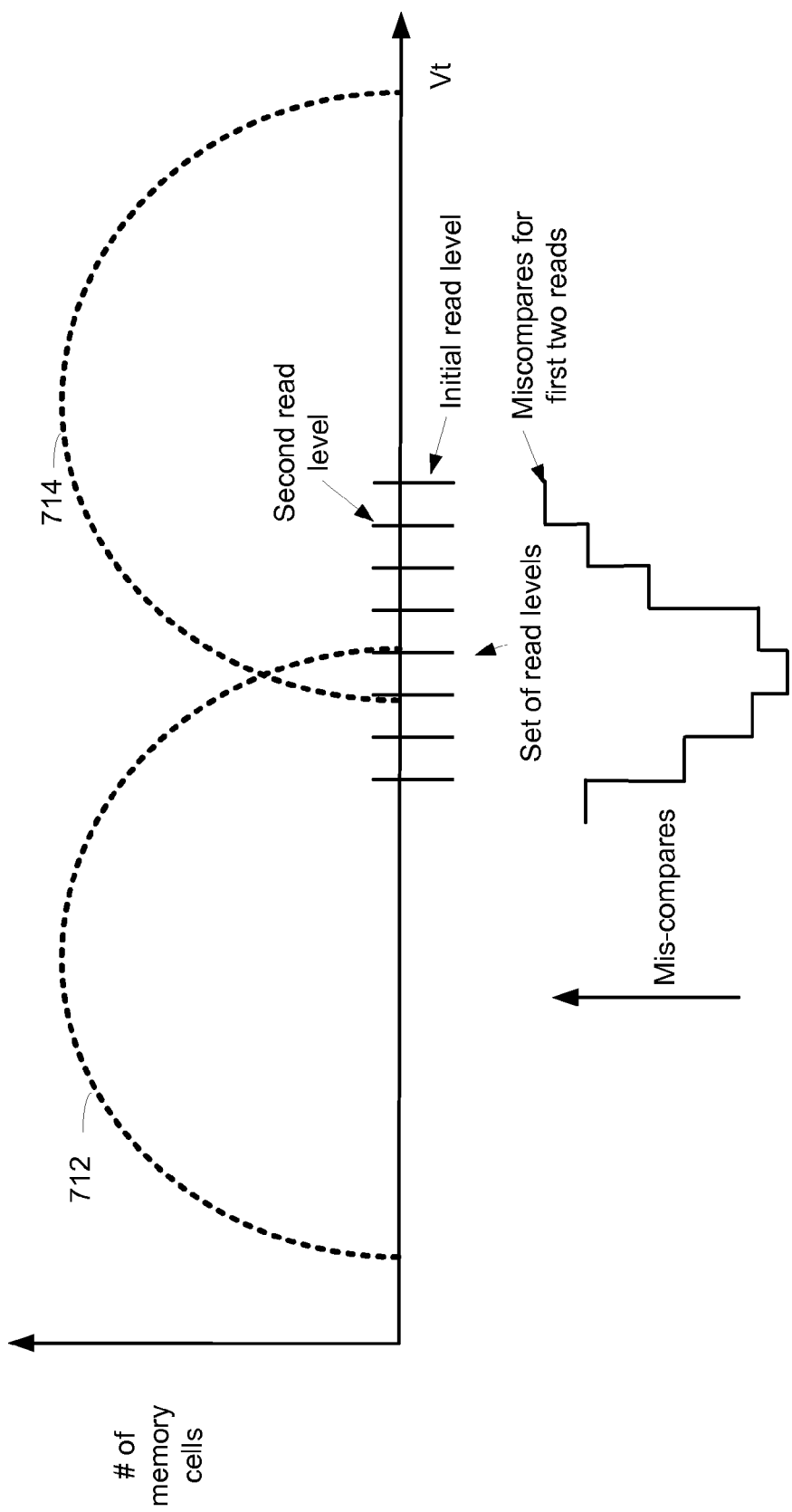
FIG. 9 depicts one embodiment of read levels and associated mis-compares.

In step 802, a group of non-volatile storage elements on a memory die 212 are read at a first set of read levels. In one embodiment, each successive read may be at a lower voltage. In one embodiment, each successive read may be a higher voltage. In one embodiment, two reads are performed at the same read level; then, two more reads may be performed at another read level, and so on. The set of read reference levels may be near an expected read level for distinguishing between two data states. Referring briefly to FIG. 9, an example set of read levels, and associated mis-compares is depicted. Note that step 802 might include reading at only some of the read levels in the set.

In step 804, results of the reads are stored on the memory die 212. In one embodiment, after each read, the results are stored in a set of data latches. These data latches may be in the data latches 494 in a sense block 300; however, data latches could be located elsewhere on the memory die 212.

In step 806, a count of how many of the non-volatile storage elements showed different results between the two most recent of the successive reads is determined. For example, referring again to FIG. 9, a mis-compare count is depicted below each pair of neighbor read levels. The mis-compare count for the first two reads is determined by comparing the results of the initial read level and the second read level. Each memory cell that shows a different result between the initial read and the second read is considered a mis-compare. The mis-compare count can be quite high between the initial read level and the second read level. In this example, the mis-compare count drops as the read levels approach a suitable read level. The mis-compare count may be lowest at about the valley between the threshold voltage distributions. If reading were to be continued beyond this point (e.g., to still lower voltages), then the mis-compare count may go up, as indicated in FIG. 9. However, it is not required to perform all of these reads. In fact, it is not required to determine a minimum mis-compare count, as will be explained more fully below.

In step 808, a read level for distinguishing between a pair of data states is determined based on a read level when the mis-compare count reaches a pre-determined criterion. In one embodiment, the read level is set to the last read level used in step 802. In general, the pair of data states may be adjacent data states. In this example, the read level may be for distinguishing between the F-state and the G-state. Note that process 800 may be used for dynamically determining a read level for distinguishing between other pairs of data states.

In one embodiment, the pre-determined criterion in step 808 is based on error correction capabilities. For example, depending on factors such as how many memory cells are used for storing error correction codes, the controller 244 may be able to correct some number of misreads. The number of mis-compares that are allowed may be based on the ability of the controller to correct read errors. In one embodiment, the number of mis-compares that are allowed is such that the controller 244 should be able to correct read errors if the last read level used in step 802 is used.

In one embodiment, the pre-determined criterion in step 808 is that the number of mis-compares reaches a minimum.

Referring to FIG. 9, in one embodiment it is assumed that mis-compares will drop until a minimum is reached, and then rise. In order to find the minima, the count of mis-compares from one pair of reads, may be compared with the count of mis-compares from the next pair of reads. Once the count of mis-compares is found to be higher than the previous count of mis-compares, a minimum has been found.

Next, note that in the example of FIG. 9, after the initial read the next read levels are at lower voltages. The initial read may have been a default level, such as VrG' in FIG. 7. An assumption may have been made that for these data states that the threshold voltages are expected to shift down. However, for other data states, or other devices, it might be expected that the threshold voltages would shift up. Therefore, the read levels used in step 802 might increase. For some devices, or states, it may be difficult to predict which way the threshold voltages might shift. In this case, step 802 might first read with successively lower voltages. If the mis-compare count goes up instead of down, then the read levels may be increased.

Figure 10A:
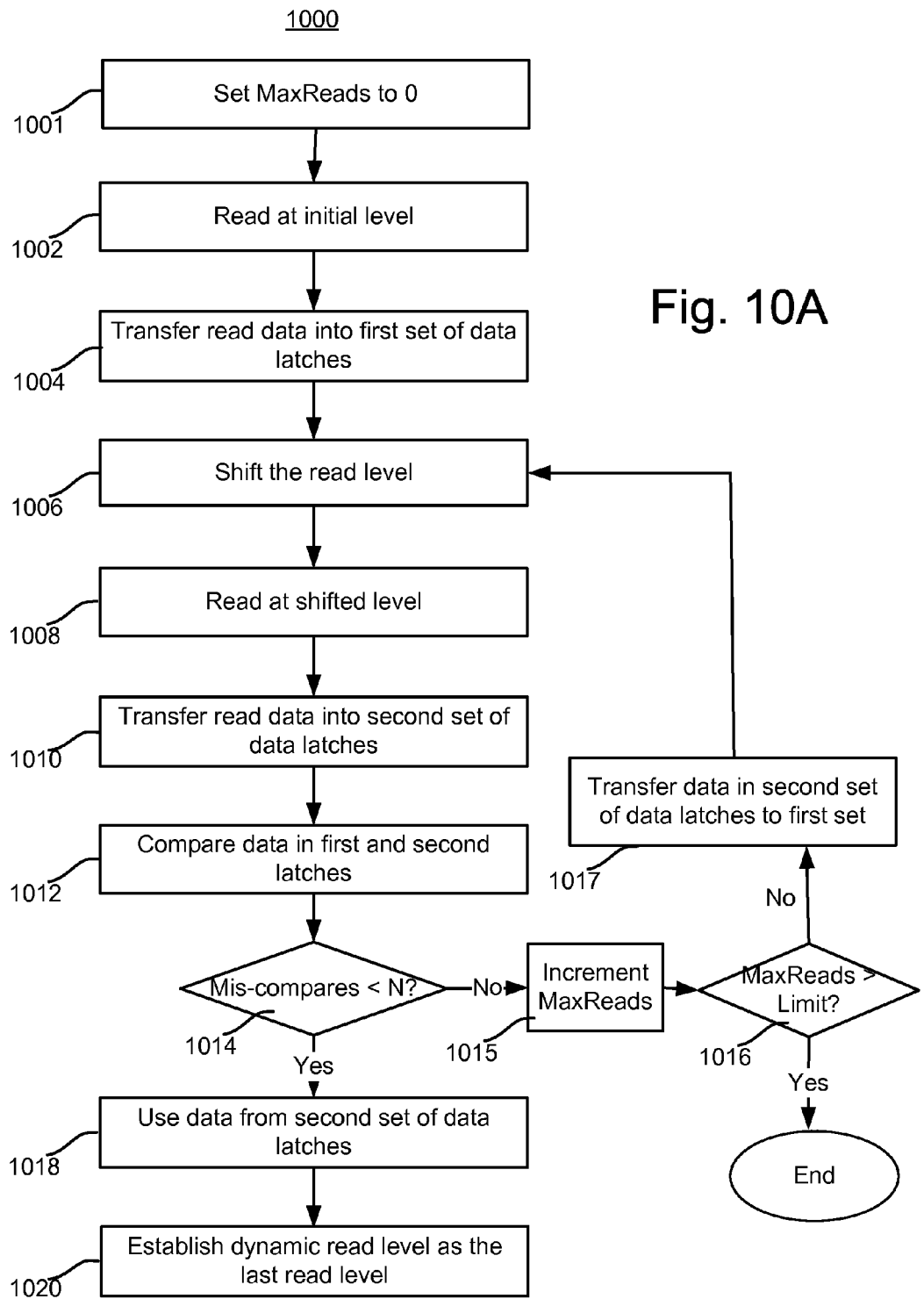
FIG. 10A is a flowchart of one embodiment of a process of dynamically determining a read level on a memory die.

FIG. 10A is a flowchart of one embodiment of a process 1000 of dynamically determining a read level on a memory die 212. Process 1000 may be used to determine a read level for distinguishing between two data states. If desired, process 1000 may be repeated to determine a read level for distinguishing between other pairs of data states. However, as will be discussed below, results of dynamically determining one read level may be used to determine read levels for distinguishing between other pairs of data states Process 1000 is one embodiment of process 800. For the sake of discussion, an example of determining a read level for distinguishing between an F-state and G-state will be used.

In step 1001, a counter for the maximum number of reads that are permitted is initialized to zero. In step 1002, reading non-volatile storage at an initial level is performed. The initial level may be the level that was most recently determined using process 1000 or another process. It could also be a default level that was set at the factory. Step 1002 may be one sub-step for one embodiment of step 802 of FIG. 8.

In step 1004, results from the initial read are transferred to a first set of data latches. There may be one data latch in the first set for each memory cell that is read. The data latches are on the memory die 212 in one embodiment. An example is the data latches 494 in the sense block 300.

In step 1006, the read level is shifted. In one embodiment, the read level is shifted in a direction that threshold voltages are expected to shift over time. The read level may be shifted down or up. Note that step 1006 may be repeated several times during process 1000. In one embodiment, the read level is shifted by the same amount each time. For example, the read level might be shifted by 50 mV each time. However, the magnitude of the voltage shift could be different from one iteration of step 1006 to the next. Also, the direction of the shift may change. For example, initially the shift might be to lower voltages. However, if it does not appear that progress is being made to locate a suitable read level, then the read level might be shifted upwards.

In one embodiment, the amount of shift is a function of the mis-compare count. For example, the shift may be large when the mis-compare count is high, and as the mis-compare count reduces, the shift in read level is also reduced. The mis-compare count suggests how far the read level was from the valley between two threshold voltage distributions. When the mis-compares are high, it is likely that the read level is away from the valley position, which means a larger shift can be made during the next iteration, without skipping over the valley position.

In step 1008, the memory cells are read at the new read level. In step 1010, results of the read of step 1008 are transferred to a second set of data latches. In one embodiment, these latches are on the memory die 212. As one example, the data latches are in data latches 494 in sense block 300.

Figure 10B:
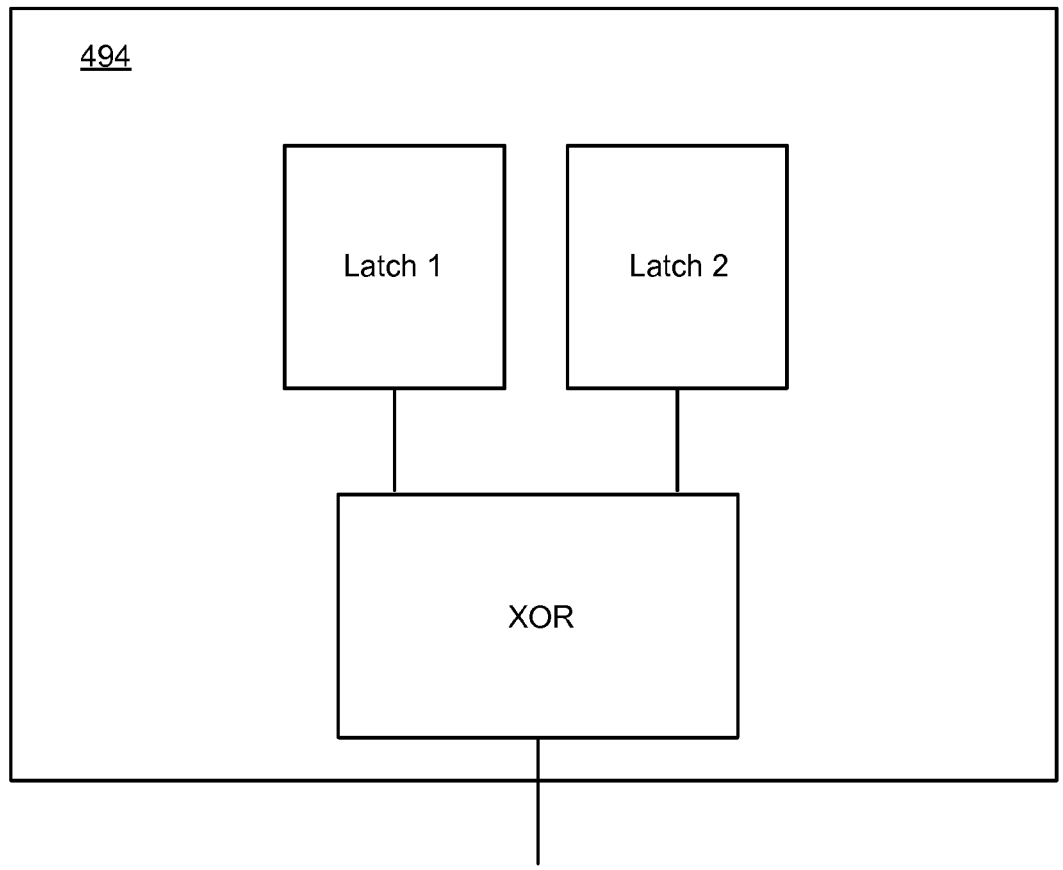
FIG. 10B depicts one embodiment of data latches.

In step 1012, the results in the first and second sets of data latches are compared. In one embodiment, an XOR logic operation is performed between the first and second data latches, on a memory cell by memory cell basis. Therefore, if the read results for a given memory cell were the same for the two reads, then the comparison produces a "0," in this embodiment. However, if the read results for a given memory cell were different for the two reads, then the comparison produces a "1," in this embodiment. A comparison result of "1" may be referred to herein as a "mis-compare." FIG. 10B depicts one embodiment of latches 494 having a Latch 1, Latch 2, and an XOR circuit for determining the exclusive OR between the results in the two latches. The XOR circuit may output a mis-compare result. There may be one such latch 494 for each memory cell being read.

In step 1014, the number of mis-compares for the memory cells being read, are totaled and compared to a threshold number. In one embodiment, the threshold number is based on the error correction capabilities of the controller. Further details are discussed below. In one embodiment, the number of mis-compares that are output by the XOR of FIG. 10B can be summed on the memory die 212. In one embodiment, once the total reaches some limit (e.g., 32, 64, etc.) counting stops.

If the mis-compares are greater than the threshold, this may indicate that a suitable read level has not yet been found. If so, the count of the MaxReads is incremented by one, in step 1015. Then, MaxReads is compared to a limit in step 1016. Note that in some cases, the number of mis-compares might not reach a level below the threshold (step 1014) within the maximum number of iterations allowed. This may indicate that the data is unreadable. However, it may also be that other techniques may be used to read the data. Process 1000 may end if the number of mis-compares fails to become lower than the threshold despite attempts to read at different read levels. In one embodiment, the process 1000 ends by using the results for the read level corresponding to the lowest number of mis-compares even if that number is not lower than the threshold. Any read errors may well be correctable, especially if the threshold was well within the margin of correctable errors.

As long as the maximum number of reads have not been performed, process 1000 may return to step 1006 to shift the read level. Also, in step 1017, the results stored in the second set of data latches may be transferred to the first set of data latches. Thus, when the next read is performed, the second set of data latches is free to store the latest read results. In one embodiment, rather than actually transferring results from the second set of data latches to the first set of data latches in step 1016, the roles of the data latches are reversed. For example, the next read results may be stored in the first set of data latches (rather than the second set as indicated in step 1010).

Eventually, the number of mis-compares should become lower than the threshold (step 1014=yes). This may indicate that the most recent read level was suitable to read the memory cells. In one embodiment this indicates that the error correction being used will be able to correct any misreads. Note that the threshold number is step 1014 may be set at a significantly lower level than a borderline case for correcting errors. For example, it might be that the error correction could correct 100 misreads. However, the threshold might be set such that there are likely to be fewer than 40 misreads. Note that the number of mis-compares, in general, is not the same as the number of misreads. However, in some embodiments, there is a relationship or correlation between the number of mis-compares and the number of misreads.

In step 1018, the results in the second set of latches may be used as actual read results. In one embodiment, these results are shifted out of the data latches 494 for further processing. Note that these results indicate whether each memory cell has a threshold voltage above or below a given read level. In other words, the results may distinguish between two data states. For example, the results may distinguish between the F-state and the G-state. Reads at other read levels (e.g., VrA, VrB, etc.) may be performed in order to determine the data state of each memory cell.

Note that final read level may be stored for later use. For example, the next time that this group of memory cells are to be read, the final read level could be used as the initial read level in step 1002. The final read level may be stored in one of the temporary registers on the memory, or else it may be stored externally in the controller's non-volatile memory. However, note that it is not required that process 1000 be used each time that the memory cells are read. In one embodiment, the memory cells are simply read using the final read level. Thus, in one embodiment, the final read level is stored, in step 1020. Note that the read level may be determined without sending read results off the memory die 212. For example, there is no need to send the read results to an external controller to perform complex calculations. Moreover, the read level may be found without applying ECC corrections to the results. However, note that ECC corrections may be applied after the read level is dynamically found.

Figure 11A:
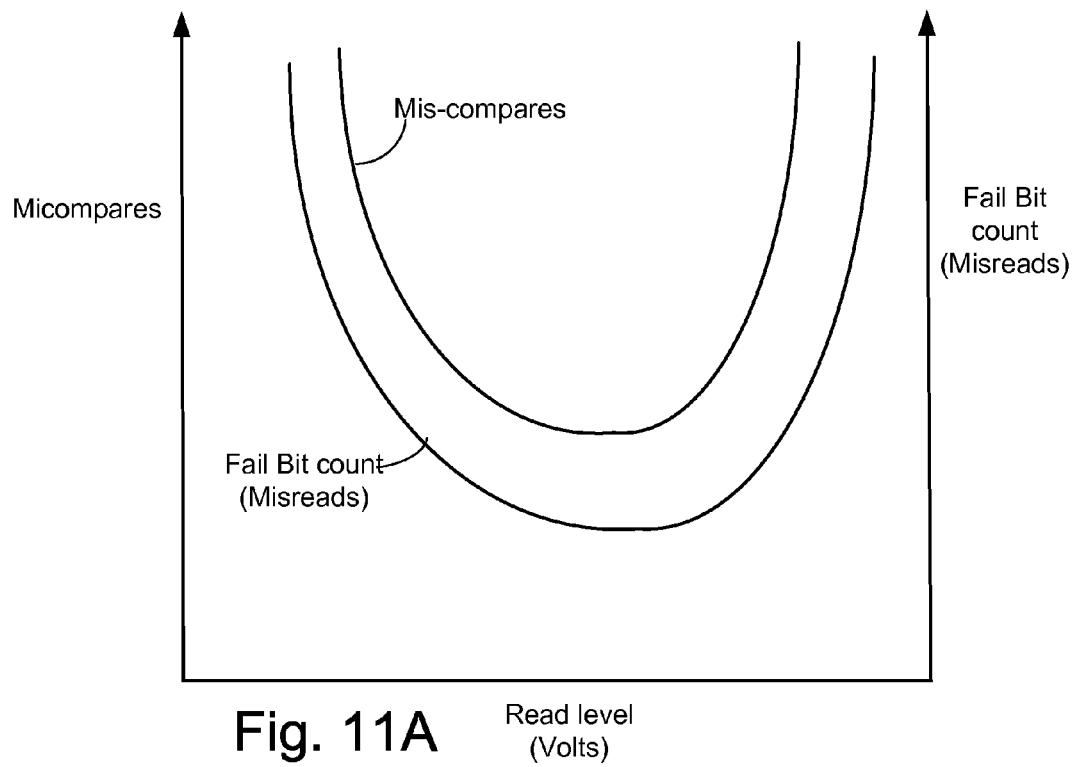
FIG. 11A depicts a graph of a possible relationship between mis-compares and misreads for one embodiment.

FIG. 11A depicts a graph of a possible relationship between mis-compares and misreads (also referred to as fail bit count) for one embodiment. The mis-compares and misreads are plotted versus read voltage level. The mis-compares may be the mis-compares from process 800 or process 1000, as examples. The read level for a mis-compare point may be the most recent read level that was used, among the pair of read levels for which the mis-compare count was determined. The scale for the mis-compares is in arbitrary units. Likewise, the scale for the misreads is in arbitrary units.

Figure 11B:
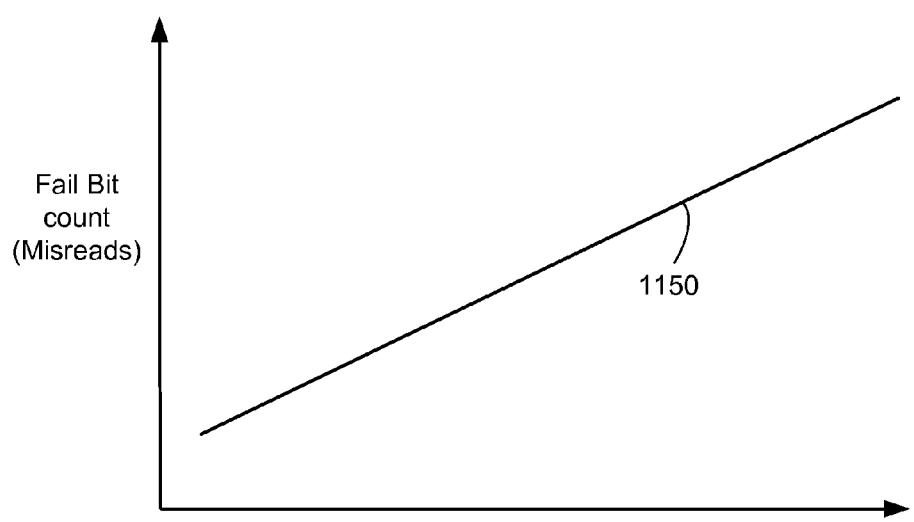
FIG. 11B depicts a graph indicating a correlation between misreads and mis-compares for one embodiment.

In general, mis-compares may correlate to misreads in the graph of FIG. 11A. FIG. 11B depicts a graph indicating a correlation 1150 between misreads and mis-compares for one embodiment. Note that if the threshold is set to some specific number (e.g., 20), then this may correlate to a certain number of misreads. Therefore, the threshold may be set to correlate to some tolerable number of misreads. Note that the number of misreads may be well below the ECC capability of the controller 244 on the memory device.

Figure 12:
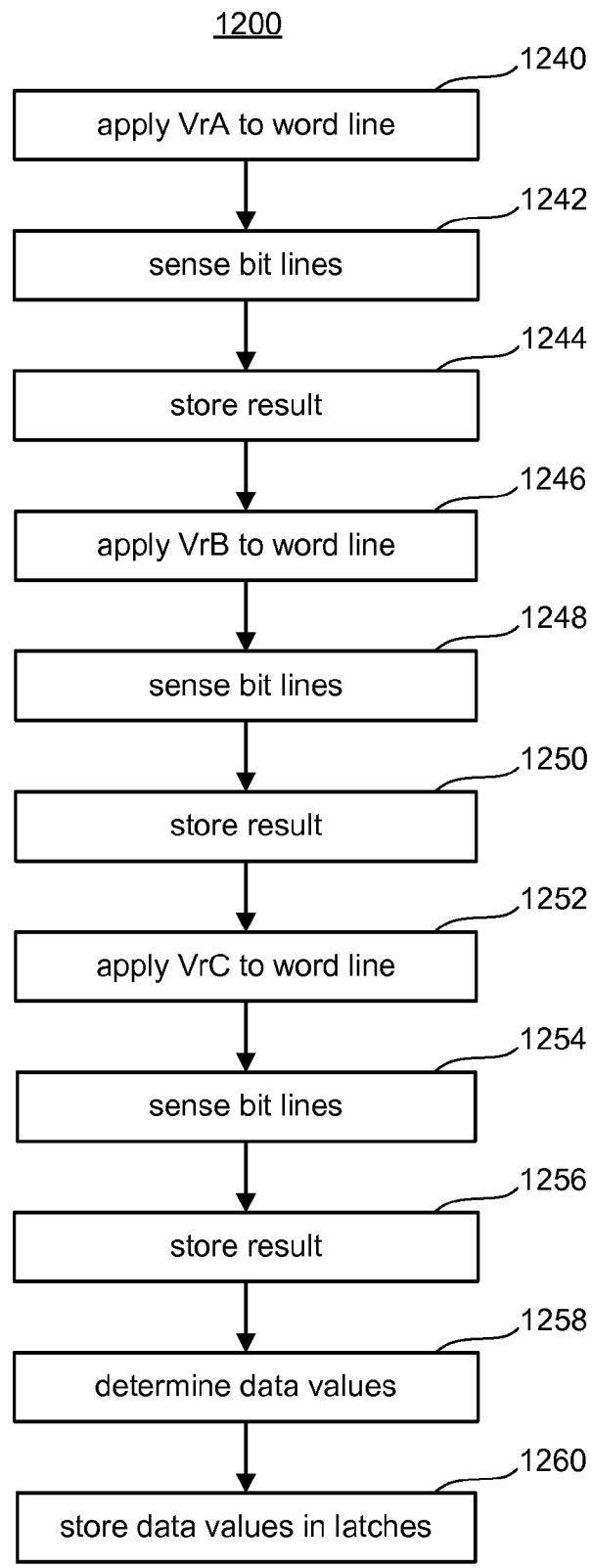
FIG. 12 is a flow chart describing one embodiment of a process for performing a read operation.

FIG. 12 is a flow chart describing one embodiment of a process 1200 for performing a read operation. FIG. 12 describes a general read process without describing how dynamic read levels are established. In process 1200 reads with read levels VrA, VrB, and VrC are used. Thus, process 1200 describes reading memory cells that store two-bits per cell. Note that dynamic read may be used to determine voltage levels for one or more of VrA, VrB, and VrC.

The process of FIG. 12 can be performed for a page that encompasses all bit lines of a block, only odd bit lines of a block, only even bit lines of a block, or other subsets of bit lines of a block. In step 1240, read reference voltage Vra is applied to the appropriate word line associated with the target page. In step 1242, the bit lines associated with the page are sensed to determine whether the addressed memory cells turn on or do not turn on based on the application of Vra to their control gates. Bit lines that conduct indicate that the memory cells were turned on; therefore, the threshold voltages of those memory cells are below Vra (e.g., in the Erase state). In step 1244 the result of the sensing for the bit lines is stored in the appropriate latches for those bit lines.

In step 1246, read reference voltage Vrb is applied to the word lines associated with the page being read. In step 1248, the bit lines are sensed as described above. In step 1250, the results are stored in the appropriate latches for the bit lines.

In step 1252, read reference voltage Vrc is applied to the word lines associated with the page. In step 1254, the bit lines are sensed to determine which memory cells turn on, as described above. In step 1256, the results from the sensing step are stored in the appropriate latches for the bit lines.

In step 1258, the data values for each bit line are determined. For example, if a memory cell conducts at Vra, then the memory cell is in the Erased state. If a memory cell conducts at Vrb and Vrc but not at Vra, then the memory cell is in state A. If the memory cell conducts at Vrc but not at Vra and Vrb, then the memory cell is in state B. If the memory cell does not conduct at Vra, Vrb or Vrc, then the memory cell is in state C. In other embodiments, sensing the various levels (Vra, Vrb, and Vrc) may occur in different orders.

Figure 13A:
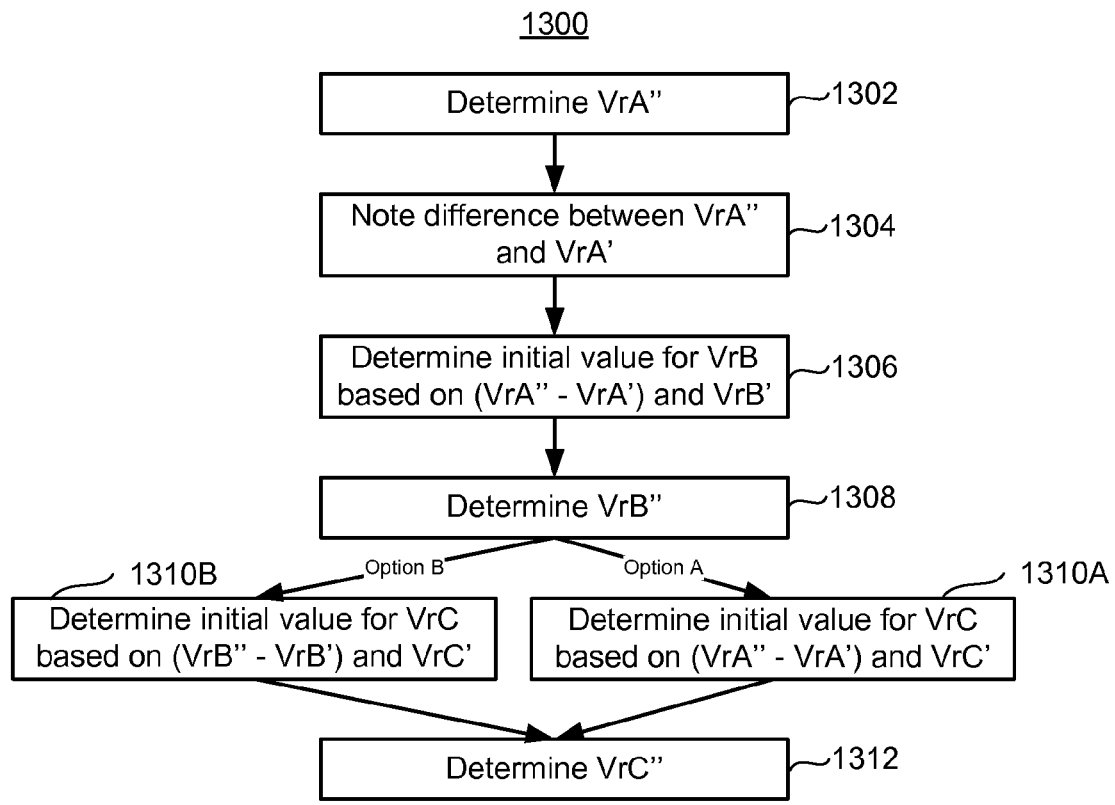
FIG. 13A describes a flowchart of one embodiment of a process of dynamically determining read levels.

FIG. 13A describes a flowchart of one embodiment of a process 1300 of dynamically determining read levels. Process 1300 describes one embodiment of determining read levels dynamically for use in the read operation of FIG. 12. Process 1300 may be modified for memory cells that store more than two bits per memory cell.

In process 1300, a process such as process 800 or 1000 may be used to dynamically determine a read level (e.g., VrA) for distinguishing between two states. Then, initial values for subsequent read levels (e.g., VrB, VrC) may be determined based on the first one. For example, initial values for VrB and VrC can be determined for use in a process such as 800 or 1000. The notation used in describing FIG. 13A will be as follows. A single prime will be used to refer to the read level that was used for the last read. A double prime will refer to the read level that is dynamically determined at this time. For example, VrA' refers to the read level for the last read operation, whereas VrA" refers to the new read level to be dynamically determined. If no primes are used, this indicates a general reference to the read level.

In step 1302, a read level for VrA" is dynamically determined. In one embodiment, process 800 is used. In one embodiment, process 1000 is used. Note that the process of determining VrA" may accomplish steps 1240-1244 of FIG. 12. For example, applying the last read level used during process 1000 may be considered to be applying VrA to a word line (step 1240). Step 1018 of using the last set of results may be considered to be one embodiment of step 1244 (storing results).

In step 1304, the difference between VrA" and VrA' is noted. For example, VrA" may be 150 mV less than VrA'. As one example, VrA' may have been the default read level that was set in the factory. Thus, this indicates that this read level has shifted by 150 mV from the default level.

In step 1306, an initial value for VrB is determined based on VrB' and the difference between VrA" and VrA'. In the simplest example, the initial value for VrB could be adjusted by the difference between VrA" and VrA'. However, the threshold voltages for different states might be expected to shift be different amounts. Therefore, the initial value for VrB might differ from VrB' by some other amount.

In step 1308, the initial value for VrB is used in a process to dynamically determine a new read level VrB". For example, the initial value for VrB may be used in step 1002 of FIG. 10. Then, process 1000 may continue until it concludes. The last read level use in process 1000 may be used as the new read level VrB".

Note certain steps of process 1000 to determine VrB" may be one embodiment of steps 1246-1250. For example, applying the last read level in process 1000 may be one embodiment of step 1246 (applying VrB to the word line). Also, using data from the second set of latches (step 1018) may be considered to be one embodiment of step 1250 (storing the results of reading at VrB).

In step 1310, an initial value for VrC is determined. Option A is to determine VrC based on VrC' and the difference between VrA" and VrA', in step 1310A. Option B is to determine VrC based on VrC' and the difference between VrB" and VrB', in step 1310B. In one embodiment, VrC is determined based on a combination of (VrB"−VrB') and (VrA"−VrA'). Note that it may be better to determine VrC based on a state that is closest to VrC, if it is expected that its Vt shift will be closer to its closest state. Similar to the case for the initial value for VrB, the initial value for VrC may be determining by adjusting VrC' by the difference between VrB" and VrB'. However, the initial value for VrC might differ from VrC' by some other amount.

In step 1312, the initial value for VrC is used to dynamically determine VrC". For example, the initial value for VrC is used in step 1002 of FIG. 10. Then, process 1000 continues until VrC" is determined. Note that steps 1252-1256 of FIG. 12 may be accomplished by performing process 1000 to determine VrC".

Note that process 1300 may save time by reducing the number of reads that are needed in process 1000. Specifically, when determining VrB" and VrC" time may be saved. Note that when seven (for 3-bits per cell memory) or 15 read levels (for O-bits per cell memory) needs to be found, even more time may be saved.

Figure 13B:
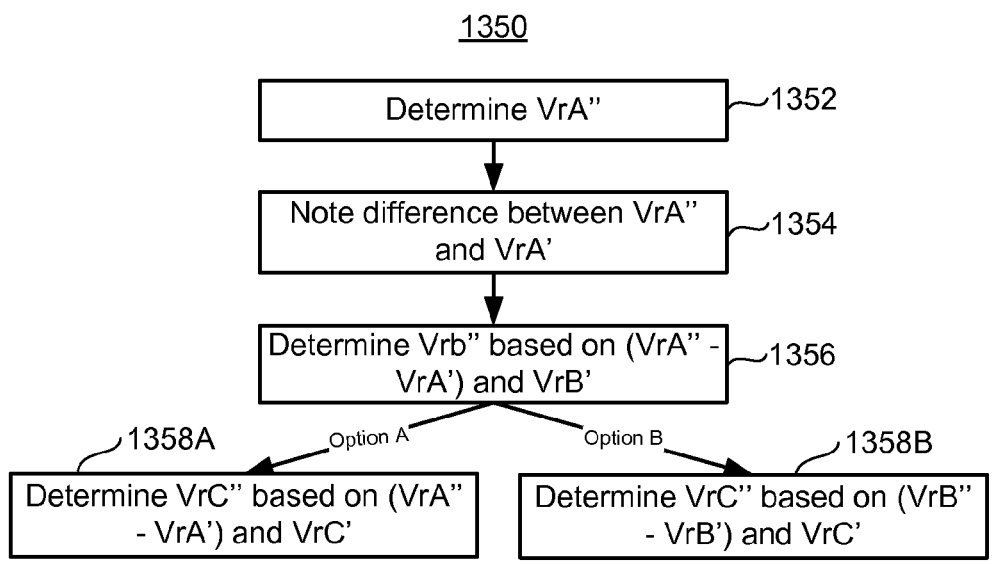
FIG. 13B describes a flowchart of one embodiment of a process of dynamically determining read levels.

Even more time may be saved by skipping process 1000 (or a similar process) for some read levels. For example, after determining VrA" using process 1000, a suitable VrB" and VrC" may be determined without performing process 1000. FIG. 13B describes a flowchart of one embodiment of a process 1350 of dynamically determining read levels in accordance with one embodiment. In process 1350, a process such as process 800 or 1000 may be used to dynamically determine a read level for distinguishing between two states (e.g., VrA). Then, other read levels may be determined based on the first one.

In step 1352, a read level for VrA" is dynamically determined. In one embodiment, process 800 is used. In one embodiment, process 1000 is used. In step 1354, the difference between VrA" and VrA' is noted. For example, VrA" may be 150 mV less than VrA'.

In step 1356, VrB" is determined based on VrB' and the difference between VrA" and VrA'. In the simplest example, VrB" could be adjusted by the difference between VrA" and VrA'. However, the threshold voltages for different states might be expected to shift be different amounts. Therefore, VrB" might differ from VrB' by some other amount, which may be based on the difference between VrA" and VrA'. For example, VrB" may differ from VrB' by the difference between VrA" and VrA' plus some additional fixed amount. Other relationships for the difference between VrB" and VrB', and the difference between VrA" and VrA' may also be used. Note that process 1000 is not performed to determine VrB" in this embodiment. Therefore, the value for VrB" may be used in step 1246 (see FIG. 12) without performing process 1000. Therefore, even more time is saved.

In step 1358, VrC" is determined. In option A, VrC" is determined based on VrC' and the difference between VrA" and VrA', in step 1358A. In option B, VrC" is determined based on VrC' and the difference between VrB" and VrB', in step 1358B. In the simplest example, VrC" could be adjusted by the difference between VrA" and VrA'. However, as mentioned above with respect to VrB", VrC" might differ from VrC' by some other amount, which may be based on the difference between VrA" and VrA', or the difference between VrB" and VrB', or based on a combination of the two differences. Again, note that process 1000 is not performed to determine VrC" in this embodiment. Therefore, the value for VrC" may be used in step 1252 (see FIG. 12) without performing process 1000.

It may be that suitable read levels for different word lines within the same block are very close to one another. Therefore, instead of dynamically determining read levels for each word line (using a process such as process 800 or 1000), the dynamically determined levels from one word line, may be saved on a temporary register in the memory, from which it could be read, and used for read on another word line. In one embodiment, the same read levels are used on all word lines. However, there may be some word line to word line variation. Therefore, such variations may be accounted for.

Figure 14A:
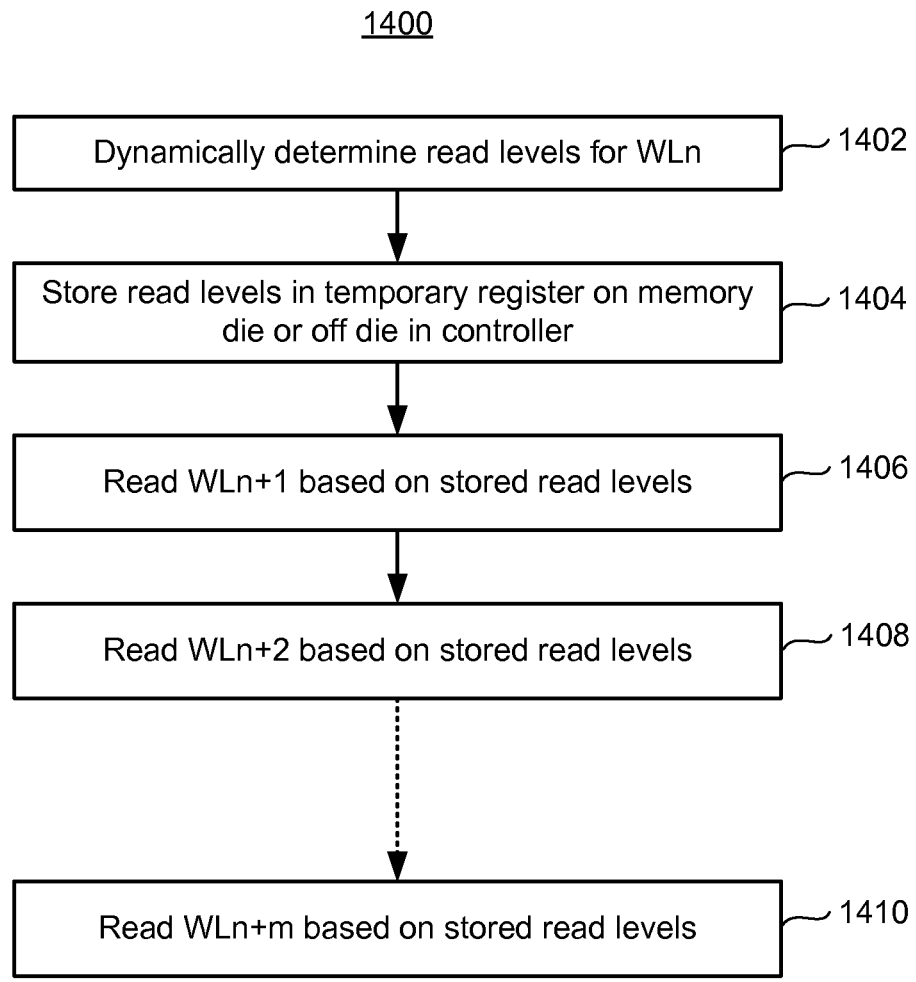
FIG. 14A is a flowchart of one embodiment of a process of using dynamically determined read levels from one word line for another word line.

FIG. 14A is a flowchart of one embodiment of a process 1400 of using dynamically determined read levels from one word line for another word line. In step 1402, read levels are dynamically determined for WLn. In one embodiment, process 800 is used. In one embodiment, process 1000 is used.

In step 1404, the dynamically determined read levels are stored in a temporary register. This register may be one the memory die 212 or off the memory die 212. For example, the read levels could be stored in the controller 244. The read levels may be stored in control circuitry 220 on the memory die 212. The read levels may be stored somewhere in the read circuits 230, or even in the memory array 200.

In step 1406, WLn+1 is read based on the stored read levels. In one embodiment, the very same read levels are used for more than one word line. In one embodiment, a word line dependency is used to determine read levels based on the stored read levels. For example, it might be that word lines near the drain select gate suffer more or suffer less than others to threshold voltage shifts. Therefore, this may be factored in to determining read levels for those word lines.

In step 1408, WLn+2 is read based on the stored read levels. In step 1410, WLn+m is read based on the stored read levels. Steps 1418-1410 may be similar to step 1406. However, as stated, word line dependencies may be factored in. The dashed arrow between steps 1408 and 1410 indicates that other word lines may be read. Note that word lines could be read in a different order than depicted in FIG. 14A.

Another way in which time can be saved when dynamically determining read levels is to sense more than one threshold voltage using the same voltage applied to a selected word line. This may be used in, for example, step 802 to read two of the read levels. Referring to FIG. 10, both the initial read of step 1002 and the second read at step 1008 may be performed using the same word line voltage. If more reads are deemed necessary in process 1000, then the third and fourth reads could be performed using the same word line voltage.

In one embodiment, dynamically determined read levels from one block may be used when reading another block. For example, a large chunk of memory may be written together and stored over multiple set of blocks, at about the same point in time. These blocks might remain largely untouched, and hence they may experience the same data-retention/thermal stress etc. It may then be expected that WLs in these blocks would show similar Vt shifts. Therefore, dynamically determined read levels from one block could be used for another.

Figure 14B:
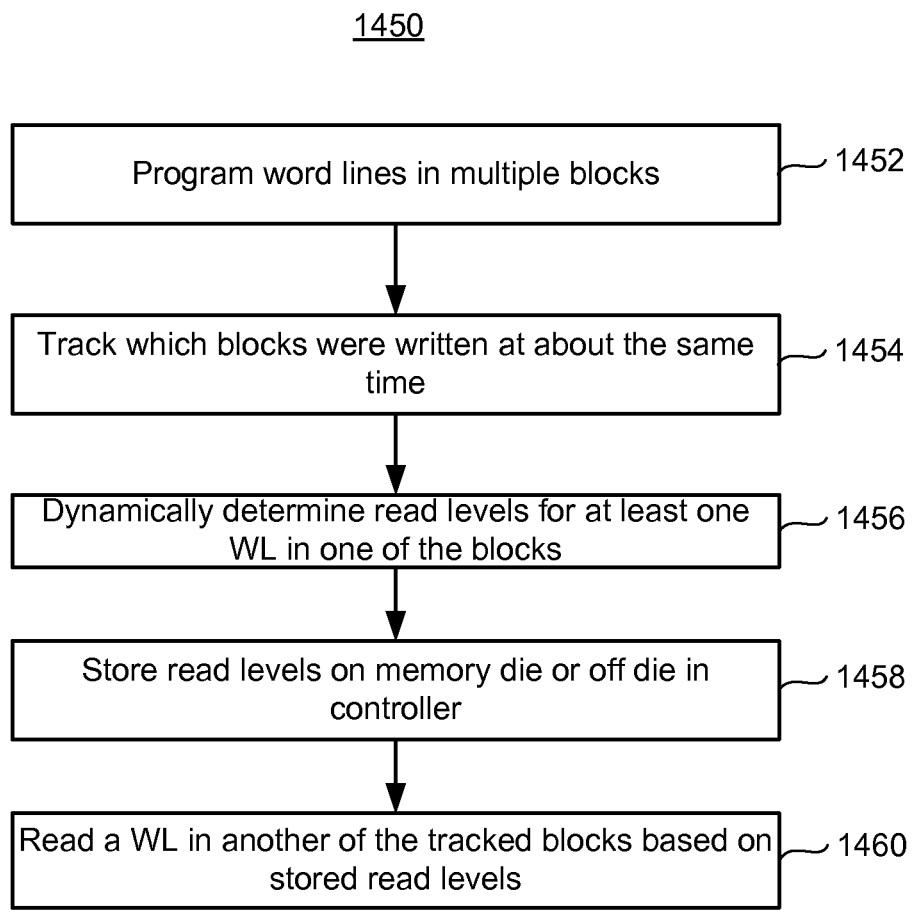
FIG. 14B is a flowchart of one embodiment of a process of using dynamically determined read levels from one block in another.

FIG. 14B is a flowchart of one embodiment of a process 1450 of using dynamically determined read levels from one block in another. In step 1452, word lines in multiple blocks are programmed. This may occur at about the same point in time. In step 1454, blocks that were written at about the same point in time are tracked. In one embodiment, the controller 244 tracks these blocks. The controller 244 may note which blocks are written at about the same point in time, and then track which blocks are left in this state. If a block (or certain word lines therein) are programmed again, the controller 244 may exclude that block (or certain word lines) that were programmed.

In step 1456, read levels are dynamically determined for at least one word line in one of the tracked blocks. In step 1458, the dynamically determined read levels may be stored either on the memory die 212 or in the controller 244. In either case, the storage may be in a temporary register or permanent storage.

In step 1460, word lines in another one of the tracked blocks are read based on the dynamically determined read levels. This may involve directly using the dynamically determined read levels, or making some adjustment to the dynamically determined read levels prior to using them in the other block. Note that it is not required to perform step 1460 immediately after step 1458.

Figure 15:
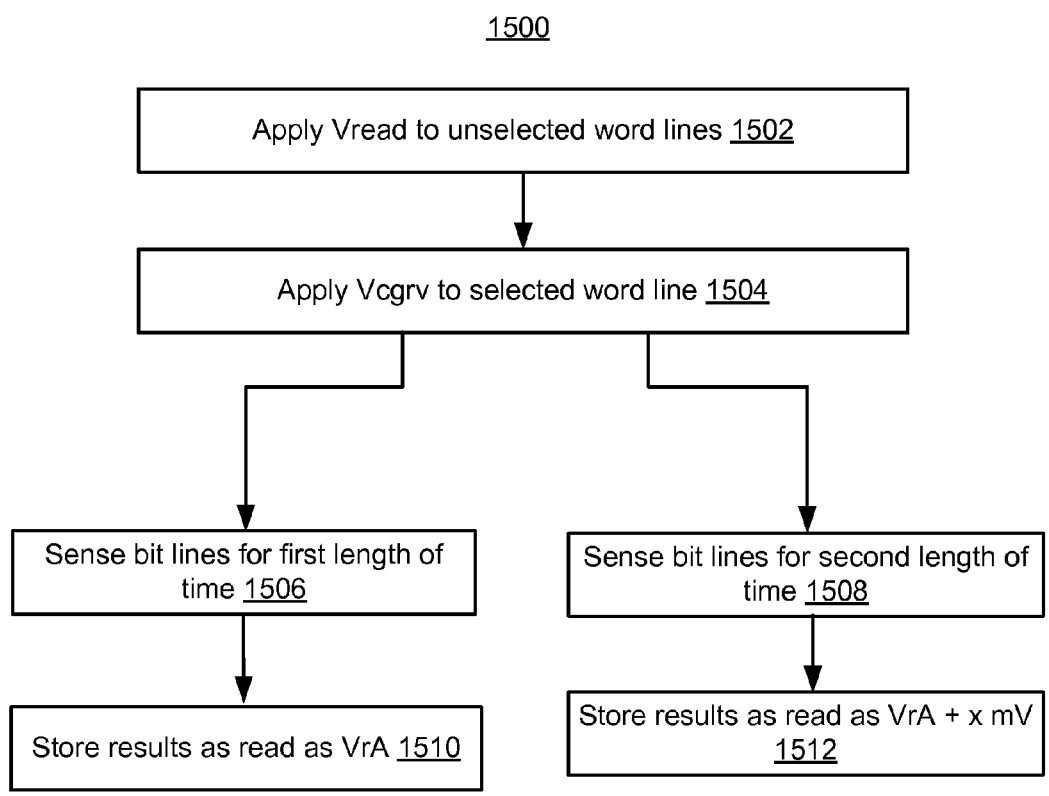
FIG. 15 is a flowchart of one embodiment of a process of sensing for two different threshold voltages using a single word line voltage.

FIG. 15 is a flowchart of one embodiment of a process 1500 of sensing two different threshold voltages using a single word line voltage. In step 1502, a read pass voltage Vread is applied to unselected word lines. The read pass voltage may be sufficiently high to cause a memory cell to conduct regardless of its data state.

In step 1504, a read compare voltage Vcgry is applied to a selected word line. The read compare voltage is typically close to the threshold voltage(s) that are being tested for in process 1500. Note that applying the read compare voltage may cause a selected memory cell on a given NAND string to conduct. Moreover, the magnitude of the conduction current may be a function of the memory cell's threshold voltage. If the memory cell's threshold voltage is below the read compare voltage, then the memory cell may have a conduction current.

In step 1506, bit lines are sensed for a first length of time. In one embodiment, a capacitor that is coupled to a given bit line is charged prior to step 1506. Then, in step 1506, the capacitor is discharged by the conduction current (if any). If the conduction current is strong enough, then the capacitor voltage will drop to a level that indicates that the memory cell turned on (e.g., conducted a current).

Note that the longer time for which the capacitor is discharged ("sense time"), the further the capacitor voltage is expected to fall for the same conduction current. Therefore, the sense time may be selected to adjust for what threshold voltage is being sensed. In one embodiment, sensing with shorter sense time means the memory cell must have higher conduction current through the NAND string to be detected as being "on", which means its Vt needs to be lower than what it needs to be if the sensing were done with a longer sense time.

In step 1508, bit lines are sensed for a second length of time. For example, the bit lines are sensed for a longer time in step 1508, which may test for a higher Vt than step 1508. Step 1508 may involve sensing the same sense capacitor as step 1506. Alternatively, two different sense capacitors may be used. In this case, a replica of the bit line current might be provided to the second capacitor.

In step 1510, the results from the first sense time are stored. In step 1512, results from the second sense time are stored. Since the first sense time is shorter, it tests for a lower threshold voltage. Therefore, the results for step 1510 are for VrA, whereas the results for step 1512 are for VrA+x mV. However, in another embodiment, the first sense time may be longer than the second sense time. In this case, the result for step 1510 are for VrA, whereas the result of step 1512 are for VrA−x mV, where x is >0.

Figure 16:
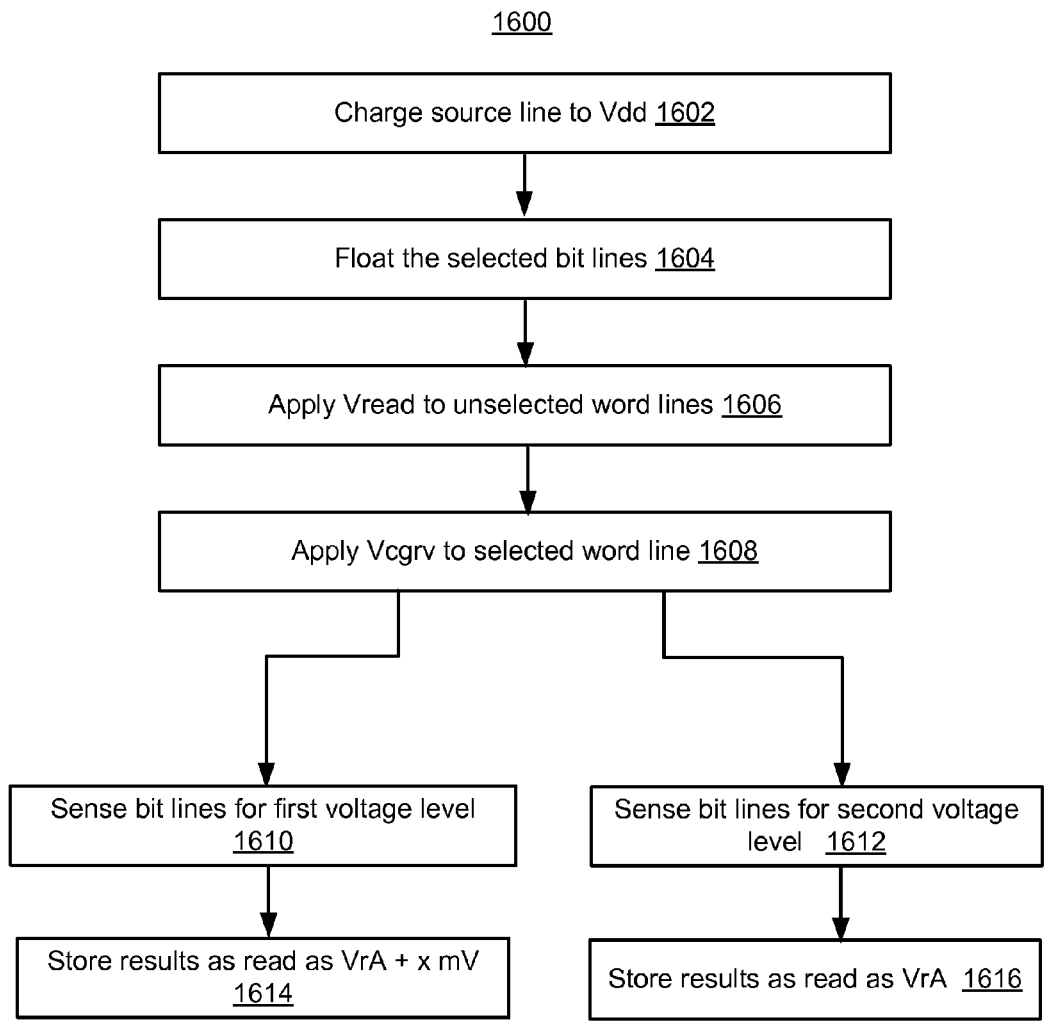
FIG. 16 is a flowchart of one embodiment of a process of reading using source-follower sensing.

Note that FIG. 15 is one embodiment for sensing two different Vts using the same word line voltage. In one embodiment, source-follower sensing is used instead. FIG. 16 is a flowchart of one embodiment of a process 1600 of reading using source-follower sensing. Process 1600 may be used during step 802 to read at two different levels using the same word line voltages. Process 1600 may be used during process 1000 to read at two different levels using the same word line voltages.

In step 1602, the common source line is charged up to Vdd~2.5V. In step 1604, the selected bit lines are floated to charge up by current flowing from the common source line to the bit lines.

In step 1606, Vread is applied to the unselected word lines. In step 1608, Vcgry is applied to the selected word line. Based on the threshold voltage of the selected memory cell on each NAND string, the memory cell may conduct a current. This current may flow from the source line to the bit line, thus charging the bit line. For a highly conductive cell, within certain sensing time, a higher current may flow, thus charging up the associated bit line to a higher voltage level. On the other hand, a non-conductive cell will not let any current flow, resulting in the bit line to stay at the initial level. Thus, by sensing the voltage level at the bit line, the state of the cell can be judged.

In step 1610, the bit lines are sensed for a first voltage level. In step 1612, the bit lines are sensed for a second voltage level. These two voltage levels are intended to test for slightly different threshold voltages. Thus, two threshold voltages that differ by, for example, 50 mV could be tested for using a single word line voltage. Note that for both process 1600 and 1500, multiple thresholds were sensed using a single word line voltage, as opposed to shifting word line voltage levels to sense at two different thresholds, as done in step 1006 of process 1000. Therefore, any additional time needed for the word lines to settle between two different reads at two different Vcgry levels, is mitigated.

In one embodiment, the read levels that are used when dynamically determining read levels are different from each other by some set amount. For example, in process 1000 the second read (step 1008) may differ from the first read (step 1002) by 50 mV. Then, for the next iteration of step 1008, the read may be adjusted by another 50 mV. Note that this is one embodiment of step 802 in FIG. 8.

In one embodiment, rather than using different read levels with each successive read, the same read level may be used for the two most recent reads. Thus, in one embodiment of step 802, the same read levels is used for the two most recent reads. Note that this still allows for mis-compares to be counted. Since the read level is not changed, the mis-compares may be caused by read noise, which causes a memory cell's threshold voltage to fluctuate from one read to another. If the read level is close to the valley between two threshold voltage distributions, there are fewer memory cells close to the read level, which means only few memory cell's threshold voltage can jump around due to read noise. This means the mis-compare count should be low. On the other hand, if the read level is further away from the valley, then there will a larger population of memory cells at that point in the threshold voltage distribution, then there would be much larger number of cells that can jump around in threshold voltage and count as mis-compare. Thus, the mis-compare count can still be used as a measure that is related to misreads (or fail bit count). Note that using the same read level for two reads may save time because the word line does not need to be ramped to a different voltage between the two successive reads.

Figure 17:
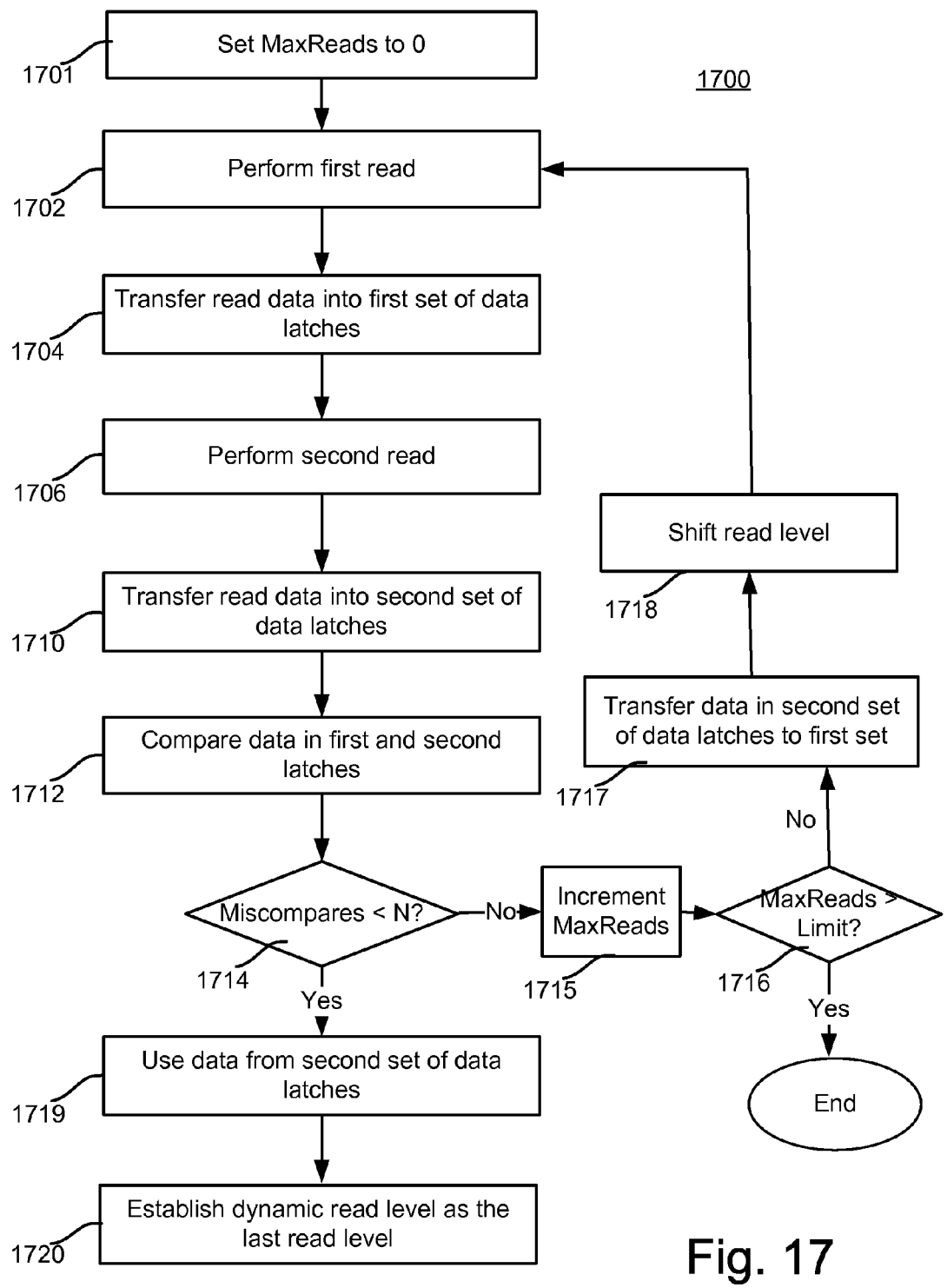
FIG. 17 depicts a flowchart of one embodiment of a process for dynamically determining read levels.

FIG. 17 depicts a flowchart of one embodiment of a process 1700 for dynamically determining read levels. Process 1700 uses the same read levels for the two most recent reads. Process 1700 is one embodiment of process 800. Since process 1700 is similar to process 1000 it will not be described in great detail.

In step 1701, MaxReads is initialized to zero. In step 1702, a first read is performed. This read is at an initial read level, which could be a default read level, the last read level used for this memory die 212, block, word line, etc. The read level might the last read level for some other word line in the block, a different block in the die, etc. In step 1704, results of the first read are transferred into a first set of data latches.

In step 1706, a second read is performed at the same level as step 1702. Note that no shift is made, in the voltage on the selected word line, thus saving time. In step 1710, results of the second read are transferred into a second set of data latches.

In step 1712, data in the first and second sets of latches are compared. In step 1714, a determination is made as to whether the mis-compares are less than some threshold number. The threshold number may be established such that it correlates to a misread count. For example, the misread count may be one that can be corrected by an ECC algorithm. In one embodiment, the mis-compare count is expected to be less when the read level is close to the optimum read level. As noted above, one possible reason for a lower mis-compare count is that the mis-compare count may be a function of noise. Near the optimum read level, there are fewer memory cells. Therefore, there should be fewer memory cells impacted by noise, in one embodiment.

If the mis-compare count is not less than the threshold, then MaxReads is incremented in step 1715. If MaxReads is over the limit (step 1716), then the process ends. Provided that the maximum number of iterations has not been performed, the data from the second set of latches is transferred to the first set of latches, in step 1717. In step 1718, the read level is shifted. In one embodiment, the read level is shifted in the direction that threshold voltage distributions are expected to move. For example, the read level may be shifted down. The read level may be shifted by any amount. In one embodiment, the amount of shift is a function of the mis-compare count. For example, the mis-compare count may, in some cases, suggest how far the read level was from the valley between two threshold voltage distributions. Thus, if mis-compare count is high, the read level for next iteration may be shifted by a larger amount, without much risk of skipping over the optimum read position which generally occurs at the valley position between the adjacent states. Similarly, small shift amounts may be used if mis-compare count is lower.

Then, steps 1702-1714 are repeated with the new read level. Eventually, the mis-compare count should be less than the threshold. When it is, the data from the second set of latches may be used, in step 1719. Note that in one embodiment, the data from the first set of latches could be used instead.

In step 1720, the dynamic read level is established based on the last read level. Note that in this case, the last read level was used in each of the last two reads. This dynamic read level may be stored for later use. It may be used when later reading the same unit (e.g., word line, block, memory die). It may also be used when reading some other unit. For example, it may be used when reading a different word line in the same block. It could also be used to help determine read levels for distinguishing between other states.

In some embodiments, dynamic read levels are determined in the field. In one embodiment, read levels are dynamically determined during wafer sort, or some other time prior to shipping the memory device. Note that this may be used to establish default read levels. Moreover, these default read levels may be tuned for different units (e.g., memory die, block, word line, etc.). Thus, in one embodiment, separate default read levels for different units are stored on the memory device.

One embodiment includes a method of operating non-volatile storage. The method comprises reading a group of non-volatile storage elements on a memory die at a first set of read levels. The group of non-volatile storage elements store a plurality of data states. Results of the two most recent of the read levels are stored on the memory die. A count of how many of the non-volatile storage elements in the group showed a different result between the reads for the two most recent read levels is determined. The determining is performed on the memory die using the results stored on the memory die. A dynamic read level is determined for distinguishing between a first pair of adjacent data states of the plurality of data states based on the read level when the count reaches a pre-determined criterion.

One embodiment includes a non-volatile storage device, comprising a memory die, a group of non-volatile storage elements on the memory die, and one or more management circuits in communication with the group of non-volatile storage elements. The group of non-volatile storage elements store a plurality of data states. The one or more management circuits read the group of non-volatile storage elements at a first set of read levels. The one or more management circuits store results of the two most recent of the read levels on the memory die. The one or more management circuits determine a count of how many of the non-volatile storage elements in the group showed a different result between the reads at the two most recent read levels. The one or more management circuits determine the count on the memory die using the results stored on the memory die. The one or more management circuits establish an adjusted read level for distinguishing between a first pair of adjacent data states of the plurality of data states based on the read level when the count reaches a pre-determined criterion.

One embodiment includes a method of operating non-volatile storage, comprising the following. A determination is made whether each non-volatile storage element in a group of non-volatile storage elements on a memory die have a threshold voltage that is above a first level. The group of non-volatile storage elements store a plurality of data states, some of the non-volatile storage elements in the group store error codes. Indications of whether each of the non-volatile storage elements in the group have a threshold voltage that is above the first level are stored on the memory die. A determination is made whether each non-volatile storage element in the group has a threshold voltage that is above a second level. Indications of whether each of the non-volatile storage elements in the group have a threshold voltage that is above the second level are stored on the memory die. A count of how many of the non-volatile storage elements have a threshold voltage that is between the first level and the second level is determined. The determining is performed on the memory die based on the stored indications. A determination is made whether the count is less than a threshold amount. The threshold amount corresponds to a level of errors that can be corrected using the error codes. One of the first level or the second level is established as a level for distinguishing between a pair of the data states if the count is less than the threshold amount.

One embodiment includes a method of operating non-volatile storage, comprising: reading a group of non-volatile storage elements on a memory die at a first read level, the non-volatile storage elements store a plurality of data states, the first read level is near a read level for distinguishing between two data states of the plurality of data states; storing, in a first data latch on the memory die, first results of the read at the first level for each of the non-volatile storage elements in the group; reading the group of non-volatile storage elements at a second read level, the second read level is near the read level for distinguishing between the two data states, the first and second read levels test for different threshold voltages; storing, in a second data latch on the memory die, second results of the read at the second level for each of the non-volatile storage elements in the group; performing an XOR between the first results in the first data latch and the second results in the second data latch to produce a mis-compare count; and using one of the first results or the second results as results for distinguishing between the two data states if the mis-compare count is less than a threshold amount.

One embodiment includes a non-volatile storage device, comprising: a memory die; a group of non-volatile storage elements on the memory die, the group of non-volatile storage elements store a plurality of data states; a first data latch on the memory die; a second data latch on the memory die; and one or more management circuits in communication with the group of non-volatile storage elements. The one or more management circuits read the group of non-volatile storage elements at a first read level, the first read level is near a read level for distinguishing between two data states of the plurality of data states. The one or more management circuits store first results of the read at the first level for each of the non-volatile storage elements in the group in the first data latch. The one or more management circuits read the group of non-volatile storage elements at a second read level. The second read level is near the read level for distinguishing between the two data states. The first and second read levels test for different threshold voltages. The one or more management circuits store second results of the read at the second level for each of the non-volatile storage elements in the group in the second data latch. The one or more management circuits perform an XOR between the first results in the first data latch and the second results in the second data latch to produce a mis-compare count. The one or more management circuits use one of the first results or the second results as results for distinguishing between the two data states if the mis-compare count is less than a threshold amount.

The foregoing detailed description has been presented for purposes of illustration and description. It is not intended to be exhaustive or to limit embodiments to the precise form disclosed. Many modifications and variations are possible in light of the above teaching. The described embodiments were chosen in order to best explain principles and practical applications, to thereby enable others skilled in the art to best utilize various embodiments and with various modifications as are suited to the particular use contemplated. It is intended that the scope of embodiments be defined by the claims appended hereto.

What is claimed is:

1. A method of operating non-volatile storage, comprising:
   a) determining whether each non-volatile storage element in a group of non-volatile storage elements on a memory die have a threshold voltage that is above a first level, the group of non-volatile storage elements store a plurality of data states, some of the non-volatile storage elements in the group store error codes;
   b) storing, on the memory die, indications of whether each of the non-volatile storage elements in the group have a threshold voltage that is above the first level;
   c) determining whether each non-volatile storage element in the group has a threshold voltage that is above a second level;
   d) storing, on the memory die, indications of whether each of the non-volatile storage elements in the group have a threshold voltage that is above the second level;
   e) determining a count of how many of the non-volatile storage elements have a threshold voltage that is between the first level and the second level, the determining is performed on the memory die based on the stored indications;
   f) determining whether the count is less than a threshold amount, the threshold amount corresponds to a level of errors that can be corrected using the error codes;
   g) establishing one of the first level or the second level as a level for distinguishing between a pair of the data states if the count is less than the threshold amount.

2. The method of claim 1, further comprising:
   repeating said a)-said g) until the count is less than the threshold amount, the non-volatile storage elements are tested for a different first and second threshold voltage levels with each repetition.

3. The method of claim 2, wherein the second level is lower than the first level, the establishing one of the first level or the second level as a level for distinguishing between a pair of the data states if the count is less than the threshold amount includes establishing the second level as the level for distinguishing between a pair of the data states.

4. The method of claim 1, wherein:
   the storing, on the memory die, indications of whether each of the non-volatile storage elements in the group have a threshold voltage that is above the first level comprises transferring first read data to a first set of data latches; and
   the storing, on the memory die, indications of whether each of the non-volatile storage elements in the group have a threshold voltage that is above the second level comprises transferring second read data to a second set of data latches.

5. The method of claim 4, wherein the determining a count of how many of the non-volatile storage elements have a threshold voltage that is between the first level and the second level comprises:
   performing an XOR between the first read data in the first set of data latches and the second read data in the second set of data latches.

6. The method of claim 1, wherein the group of non-volatile storage elements are selected non-volatile storage elements associated with different NAND strings.

7. The method of claim 1, wherein the pair of the data states include an F-state and a G-state.

8. A method of operating non-volatile storage, comprising:
   reading a group of non-volatile storage elements on a memory die at a first read level, the non-volatile storage elements store a plurality of data states, the first read level is near a read level for distinguishing between two data states of the plurality of data states;
   storing, in a first data latch on the memory die, first results of the read at the first level for each of the non-volatile storage elements in the group;
   reading the group of non-volatile storage elements at a second read level, the second read level is near the read level for distinguishing between the two data states, the first and second read levels test for different threshold voltages;
   storing, in a second data latch on the memory die, second results of the read at the second level for each of the non-volatile storage elements in the group;
   performing an XOR between the first results in the first data latch and the second results in the second data latch to produce a mis-compare count; and
   using one of the first results or the second results as results for distinguishing between the two data states if the mis-compare count is less than a threshold amount.

9. The method of claim 8, wherein some of the non-volatile storage elements in the group store error codes, the threshold amount is based on a number of errors that can be corrected using the stored error codes.

10. The method of claim 8, further comprising:
    a) transferring the second results from the second data latch for each of the non-volatile storage elements in the group to the first data latch for each of the non-volatile storage elements in the group;
    b) shifting the read level from the second read level;
    c) reading the group of non-volatile storage elements at the shifted read level;
    d) storing, in the second data latch on the memory die, third results of the read at the shifted read level for each of the non-volatile storage elements in the group, wherein the mis-compare count is a first mis-compare count;
    e) performing an XOR between the second results in the first data latch and the third results in the second data latch to produce a second mis-compare count; and
    f) using one of the second results or the third results as results for distinguishing between the two data states if the second mis-compare count is less than the threshold amount.

11. The method of claim 10, further comprising:
    repeating said a) through said f) to produce additional mis-compare counts until one of the additional mis-compare counts is less than the threshold amount.

12. The method of claim 11, wherein the shifting the read level from the second read level comprises shifting by a set amount each time said a) through said f) is repeated.

13. The method of claim 12, further comprising:
    establishing the last read level when repeating said a) through said f) as a dynamic read level.

14. The method of claim 8, wherein the reading the group of non-volatile storage elements at a second read level includes shifting the first read level by a set amount.

15. The method of claim 8, wherein the group of non-volatile storage elements are selected non-volatile storage elements associated with different NAND strings.

16. A non-volatile storage device, comprising:
    a memory die;
    a group of non-volatile storage elements on the memory die, the group of non-volatile storage elements store a plurality of data states;
    a first data latch on the memory die;
    a second data latch on the memory die; and
    one or more managing circuits in communication with the group of non-volatile storage elements, the one or more managing circuits read the group of non-volatile storage elements at a first read level, the first read level is near a read level for distinguishing between two data states of the plurality of data states, the one or more managing circuits store first results of the read at the first level for each of the non-volatile storage elements in the group in the first data latch, the one or more managing circuits read the group of non-volatile storage elements at a second read level, the second read level is near the read level for distinguishing between the two data states, the first and second read levels test for different threshold voltages, the one or more managing circuits store second results of the read at the second level for each of the non-volatile storage elements in the group in the second data latch, the one or more managing circuits perform an XOR between the first results in the first data latch and the second results in the second data latch to produce a mis-compare count, the one or more managing circuits use one of the first results or the second results as results for distinguishing between the two data states if the mis-compare count is less than a threshold amount.

17. The non-volatile storage device of claim 16, wherein the threshold amount is based on an error correction code (ECC) limit.

18. The non-volatile storage device of claim 16, wherein the mis-compare count is a first mis-compare count, wherein the one or more management circuits:

a) transfer the second results from the second data latch for each of the non-volatile storage elements in the group to the first data latch for each of the non-volatile storage elements in the group;
b) shift the read level from the second read level by a set amount;
c) read the group of non-volatile storage elements at the shifted read level;
d) store, in the second data latch on the memory die, third results of the read at the shifted read level for each of the non-volatile storage elements in the group;
e) perform an XOR between the second results in the first data latch and the third results in the second data latch to produce a second mis-compare count; and
f) use one of the second results or the third results as results for distinguishing between the two data states if the second mis-compare count is less than the threshold amount.

19. The non-volatile storage device of claim 18, wherein the one or more managing circuits repeat said a) through said f) to produce additional mis-compare counts until one of the additional mis-compare counts is less than the threshold amount.

20. The non-volatile storage device of claim 19, wherein the one or more managing circuits establish the last read level when repeating said a) through said f) as a dynamic read level.

21. The non-volatile storage device of claim 16, wherein group of non-volatile storage elements are selected non-volatile storage elements associated with different NAND strings.

* * * * *